(12) United States Patent
Kong et al.

(10) Patent No.: US 12,248,641 B2
(45) Date of Patent: Mar. 11, 2025

(54) TOUCH PANEL AND TOUCH DISPLAY DEVICE COMPRISING THE SAME

(71) Applicant: LG Display Co., Ltd., Seoul (KR)

(72) Inventors: Minsuk Kong, Paju-si (KR); Doman Kim, Paju-si (KR); Younggyu Moon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/215,652

(22) Filed: Jun. 28, 2023

(65) Prior Publication Data
US 2023/0341963 A1   Oct. 26, 2023

Related U.S. Application Data

(63) Continuation of application No. 17/538,515, filed on Nov. 30, 2021, now Pat. No. 11,726,593.

(30) Foreign Application Priority Data

Dec. 30, 2020   (KR) .................. 10-2020-0188233

(51) Int. Cl.
*G06F 3/041*   (2006.01)
*G06F 3/044*   (2006.01)
(Continued)

(52) U.S. Cl.
CPC .......... *G06F 3/0412* (2013.01); *G06F 3/0445* (2019.05); *G06F 3/0446* (2019.05);
(Continued)

(58) Field of Classification Search
CPC .... G06F 3/0412; G06F 3/0448; G06F 3/0445; G06F 3/04164; G06F 3/041; G06F 3/044; F06F 3/0446
See application file for complete search history.

(56) References Cited

U.S. PATENT DOCUMENTS 8,784,933 B2 *   7/2014   Krzyak ............... C23C 18/1216
                                                                  427/164
10,430,000 B2   10/2019   Wu et al.
(Continued)

FOREIGN PATENT DOCUMENTS

| CN | 107688415 A | 2/2018 |
| WO | WO 2014/020656 A1 | 2/2014 |
| WO | WO 2015/093855 A1 | 6/2015 |

OTHER PUBLICATIONS

Extended European Search Report, European Patent Application No. 21213991.9, May 25, 2022, 11 pages.
(Continued)

*Primary Examiner* — Olga V Merkoulova
(74) *Attorney, Agent, or Firm* — Fenwick & West LLP

(57) ABSTRACT

A touch panel and a touch display device with the same are disclosed. A touch panel is disclosed in which at least one layer of a first insulating layer is disposed on the display panel, first touch electrodes are disposed on the first insulating layer, at least one second insulating layer is disposed on a first touch electrode, second touch electrodes are disposed on the second insulating layer, a third insulating layer is disposed on the second insulating layer on which the second touch electrodes are disposed, each of the first touch electrodes and each of the second touch electrodes overlap each other, and a refractive index of at least one of the first insulating layer, the second insulating layer and the third insulating layer is different from that of the other insulating layers, thereby improving the visibility of the touch display device.

17 Claims, 17 Drawing Sheets

(51) Int. Cl.
  *H10K 50/86* (2023.01)
  *H10K 59/12* (2023.01)
  *H10K 59/40* (2023.01)
(52) U.S. Cl.
  CPC ............ *H10K 50/86* (2023.02); *H10K 59/12* (2023.02); *H10K 59/40* (2023.02)

(56) References Cited

U.S. PATENT DOCUMENTS

| | | | | |
|---|---|---|---|---|
| 2007/0292659 | A1* | 12/2007 | Li | G06F 3/041 |
| | | | | 428/323 |
| 2012/0263936 | A1* | 10/2012 | Krzyak | C03C 17/3417 |
| | | | | 977/755 |
| 2013/0171344 | A1* | 7/2013 | Krzyak | F21V 3/04 |
| | | | | 204/192.26 |
| 2014/0307183 | A1 | 10/2014 | Tang et al. | |
| 2015/0060125 | A1* | 3/2015 | Stevenson | G06F 3/0446 |
| | | | | 174/261 |
| 2015/0060817 | A1* | 3/2015 | Sato | H10K 50/822 |
| | | | | 257/40 |
| 2015/0169094 | A1 | 6/2015 | Liu et al. | |
| 2016/0190522 | A1* | 6/2016 | Lee | H10K 50/8426 |
| | | | | 257/40 |
| 2018/0039352 | A1* | 2/2018 | Wu | H10K 59/40 |
| 2019/0012022 | A1 | 1/2019 | Ye | |
| 2019/0115407 | A1* | 4/2019 | Cho | G09G 3/3225 |
| 2020/0057520 | A1* | 2/2020 | Hung | H10K 59/131 |
| 2020/0201483 | A1* | 6/2020 | Feng | G06F 3/0445 |
| 2022/0199722 | A1* | 6/2022 | Fang | H10K 50/844 |
| 2023/0209925 | A1* | 6/2023 | Fan | G06F 3/0412 |
| | | | | 257/40 |

OTHER PUBLICATIONS

United States Office Action, U.S. Appl. No. 17/538,515, filed Sep. 13, 2022, 14 pages.
United States Office Action, U.S. Appl. No. 17/538,515, filed Dec. 15, 2022, 19 pages.
China National Intellectual Property Administration, Office Action, Chinese Patent Application No. 202111174347.4, Dec. 20, 2024, 18 pages.

* cited by examiner

TOUCH PANEL AND TOUCH DISPLAY DEVICE COMPRISING THE SAME

CROSS REFERENCE TO RELATED APPLICATION

This application is a continuation application of U.S. patent application Ser. No. 17/538,515 filed on Nov. 30, 2021, which claims priority from Republic of Korea Patent Application No. 10-2020-0188233, filed on Dec. 30, 2020, which is hereby incorporated by reference in its entirety.

TECHNICAL FIELD

The present disclosure relates to a touch panel and a touch display device including the same, and more particularly, to provide a touch panel having excellent viewing angle characteristics and a touch display device including the same.

BACKGROUND

A touch display device may include a display panel for displaying an image and a touch panel for receiving a user's touch.

As the display panel, various display panels such as a liquid crystal display panel, a plasma display panel, and an electroluminescent display panel (e.g., an organic light emitting display panel) may be utilized. In particular, the electroluminescent display panel has excellent viewing angle, contrast ratio, and the like, and does not require a separate light. Accordingly, it is possible to reduce the weight and thickness of the display panel, and there is an advantage in terms of power consumption.

In addition, the touch panel is implemented to detect an input signal by the user's hand or an object.

However, in the case that the display panel of the touch display device is an electroluminescent display panel, there may be a problem in that visibility may be deteriorated due to reflection of external light.

SUMMARY

A touch panel capable of improving visibility even when an electroluminescent display panel is used as a display panel of a touch display device, and a new structure of a touch display device including the same is disclosed.

Embodiments of the present disclosure may provide a touch panel and a touch display device including the same capable of reducing external light reflectance.

Embodiments of the present disclosure may provide a touch panel and a touch display device including the same capable of improving the visibility.

The problems to be solved according to an embodiment of the present disclosure are not limited to the problems mentioned above, and other problems not mentioned will be clearly understood by those skilled in the art from the following description.

In one aspect, embodiments of the present disclosure may provide a touch display device capable of reducing external light reflectance and improving visibility.

In one aspect, at least one first insulating layer is disposed on a display panel, and a plurality of first touch electrodes are disposed on the first insulating layer. At least one second insulating layer is disposed on the first touch electrode. A plurality of second touch electrodes are disposed on the second insulating layer, and a third insulating layer is disposed on the second insulating layer on which the second touch electrode is disposed.

Each of the plurality of first touch electrodes and each of the plurality of second touch electrodes overlap each other.

In addition, at least one of the first insulating layer, the second insulating layer and the third insulating layer includes a plurality of layer having different refractive indices.

In another aspect, embodiments of the present disclosure may provide a touch panel capable of reducing external light reflectance and improving visibility.

A first high refractive layer is disposed on a first low refractive layer, and a plurality of first touch electrodes are disposed on the first high refractive layer. A second low refractive layer is disposed on the first touch electrode, and a plurality of second touch electrodes are disposed on the second low refractive layer. A second high refractive layer is disposed on the second touch electrode, and a third low refractive layer is disposed on the second high refractive layer.

Each of the plurality of first touch electrodes and each of the plurality of second touch electrodes overlap each other.

Further, at least one hole is provided in at least one of the first high refractive layer, the second high refractive layer and the second low refractive layer, and the hole does not overlap the plurality of first touch electrodes and the plurality of second touch electrodes.

According to embodiments of the present disclosure, by a configuration in which at least one insulating layer disposed on the touch panel has at least one hole or has a depression, it is possible to lower the the reflectance of the external light since the external light is trapped inside the touch panel and cannot be emitted outside.

According to embodiments of the present disclosure, it is possible to provide a touch panel in which, among a plurality of insulating layers disposed on the touch panel, the insulating layers having the same or similar refractive index are continuously disposed, thereby preventing or at least reducing the stains from being recognized due to the external light emitted to the outside of the touch panel, thereby improving visibility.

The effects of the present disclosure are not limited to the above-mentioned effects, and other effects not mentioned will be clearly understood by those skilled in the art from the following description.

DETAILED DESCRIPTION

Figure 1:
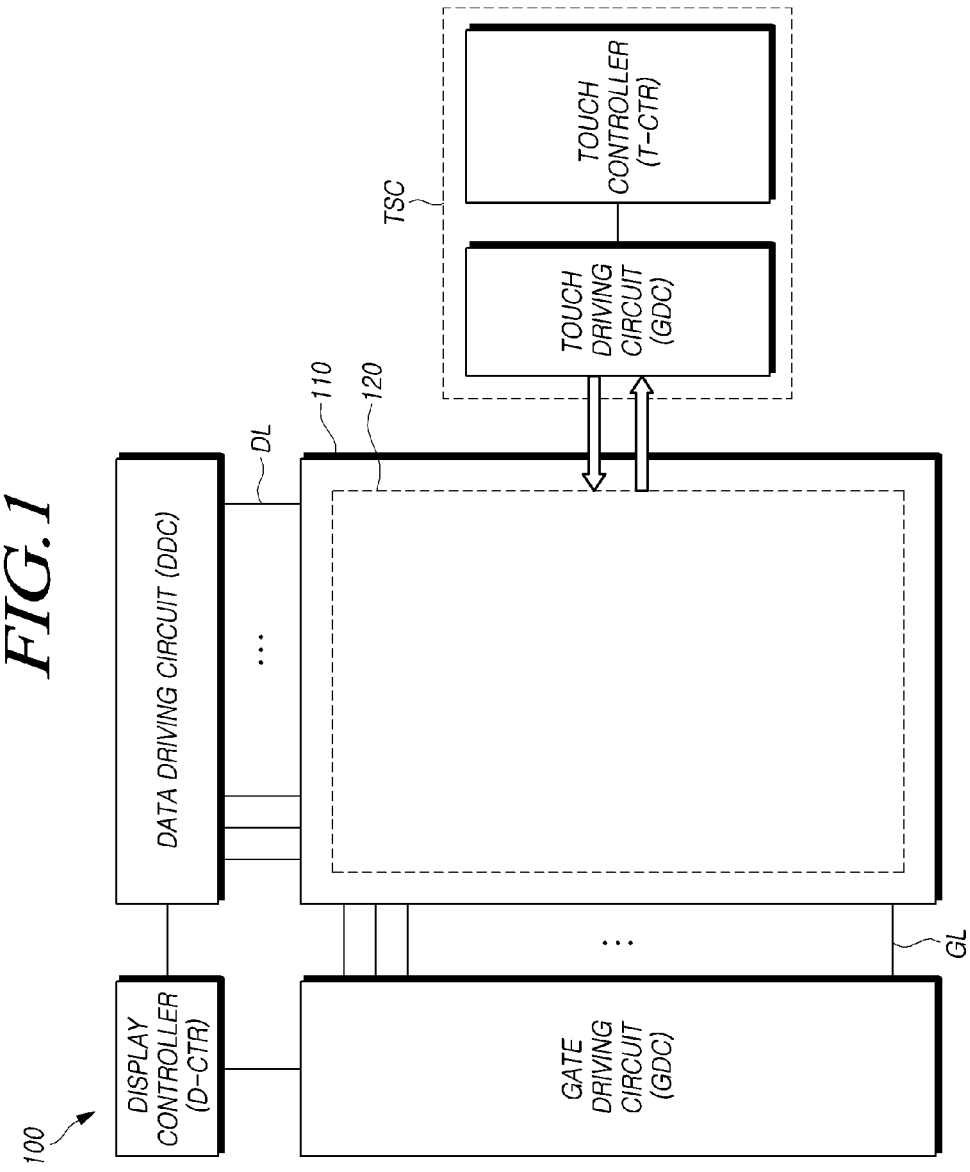
FIG. 1 illustrates a system configuration of a touch display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Each feature of the various embodiments of the present disclosure may be partially or entirely combined with each other, and may be technically interlocked and drived. In addition, each embodiment may be independently implemented with respect to each other or may be implemented together in an association relationship.

A touch display device according to an embodiment of the present disclosure may include at least one first insulating layer disposed on a display panel, a plurality of first touch electrodes disposed on the first insulating layer, at least one second insulating layer disposed on the first touch electrode, a plurality of second touch electrodes disposed on the second insulating layer, and at least one third insulating layer disposed on the second touch electrode. Here, each of the plurality of first touch electrodes and each of the plurality of second touch electrodes may overlap each other, and at least one of the first insulating layer, the second insulating layer and the third insulating layer includes a plurality of layer having different indices.

The first insulating layer may include a first low refractive layer disposed on the display panel and a first high refractive layer disposed on the first low refractive layer, the second insulating layer may include a second low refractive layer disposed on the plurality of first touch electrodes, and the third insulating layer may include a second high refractive layer disposed on the plurality of second touch electrodes and a third low refractive layer disposed on the second high refractive layer.

The second low refractive layer may include at least one first hole provided in an area which does not overlap each of the plurality of first touch electrodes and the plurality of second touch electrodes, and the first hole may expose a portion of a lower surface of the second high refractive layer, and the first high refractive layer and the first low refractive layer may be disposed in the first hole.

In addition, the first touch electrode and second touch electrode overlapping each other may cross the other adjacent first and second touch electrodes at least twice, and an opening may be provided between the crossing points of the first and second touch electrodes and the other adjacent first and second touch electrodes. The first hole may overlap the opening.

The first high refractive layer may include at least one second hole provided in an area which does not overlap each of the plurality of first touch electrodes and the plurality of second touch electrodes, and the second hole may exposes a portion of a lower surface of the second low refractive layer. The first low refractive layer and the second low refractive layer may be in contact with each other through the second hole.

In addition, the first and second touch electrodes overlapped with each other are twisted at least once, the first touch electrode and second touch electrode overlapping each other may cross the other adjacent first and second touch electrodes at least twice, and an opening is provided between one crossing point of the first and second touch electrodes and another adjacent crossing point.

Further, one opening and another adjacent opening may be disposed to be spaced apart from each other, and at least one second hole may be further disposed in a region where the openings are spaced apart from each other.

Here, the second hole may have a closed curve shape.

The second high refractive layer may include at least one third hole overlapping the at least one second hole. The third hole may expose a portion of a lower surface of the third low refractive layer, and the second low refractive layer and the third low refractive layer may be in contact with each other through the third hole.

A shape of the third hole may correspond to a shape of the second hole overlapping the third hole.

The second high refractive layer may be disposed on the portion of the upper surface of the second low refractive layer, and may not overlap the second hole of the first high refractive layer.

In addition, the second high refractive layer may include at least one depression, and the depressions may be spaced apart from each other.

The first touch electrode and second touch electrode overlapping each other may cross the other adjacent first and second touch electrodes at least twice, and an opening may be provided between the crossing points of the first and second touch electrodes and the other adjacent first and second touch electrodes, and the depression may overlap the opening.

At least one depression may be further disposed in an area between the one opening and the other adjacent opening.

The first insulating layer of the touch display device may include a first low refractive layer disposed on the display panel and a first high refractive layer disposed on the first low refractive layer, the second insulating layer may include a second high refractive layer disposed on the plurality of first touch electrodes, and the third insulating layer may include a third high refractive layer disposed on the plurality of second touch electrodes and a second low refractive layer disposed on the third high refractive layer.

Here, a portion of the first high refractive layer and a portion of the second high refractive layer may be in contact with each other, and a portion of the second high refractive layer and a portion of the third high refractive layer may be in contact with each other.

A touch panel according to an embodiment of the present disclosure may include a first high refractive layer disposed on a first low refractive layer, a plurality of first touch electrodes disposed on the first high refractive layer, a second low refractive layer disposed on the first touch electrode, a plurality of second touch electrodes disposed on the second low refractive layer, a second high refractive layer disposed on the second touch electrode, and a third low refractive layer disposed on the second high refractive layer. Here, each of the plurality of first touch electrodes and each of the plurality of second touch electrodes may overlap each other, and at least one hole may be provided in at least one of the first high refractive layer, the second high refractive layer and the second low refractive layer, and the hole may not overlap the plurality of first touch electrodes and the plurality of second touch electrodes.

A hole of the first high refractive layer may overlap a portion of the first low refractive layer, and the second low refractive layer and the first low refractive layer may be in contact with each other through the hole of the first high refractive layer.

A hole of the second high refractive layer may overlap a portion of the second low refractive layer, and the second low refractive layer and the third low refractive layer may be in contact with each other through the hole of the second high refractive layer.

A hole of the second low refractive layer may overlap a portion of the first high refractive layer, and the first high refractive layer and the second high refractive layer may be in contact with each other through the hole of the second low refractive layer.

Hereinafter, it will be described embodiments of the present disclosure in detail with reference to the accompanying drawings.

FIG. 1 illustrates a system configuration of a touch display device according to embodiments of the present disclosure.

Referring to FIG. 1, a touch display device according to embodiments of the present disclosure may provide an image display function for displaying an image and a touch sensing function for sensing a user's touch.

The touch display device 100 according to the embodiments of the present disclosure may include, for displaying an image, a display panel 110 on which data lines and gate lines are disposed, and a display driving circuit for driving the display panel 110.

The display driving circuit may include a data driving circuit DDC for driving the data lines, a gate driving circuit GDC for driving the gate lines, and a display controller D-CTR for controlling the data driving circuit DDC and the gate driving circuit GDC.

The touch display device 100 according to the embodiments of the present disclosure may include a touch panel 120 on which a plurality of touch electrodes are disposed as a touch sensor for touch sensing, and a touch sensing circuit TSC for driving the touch panel 120 and performing sensing processes.

The touch sensing circuit TSC may supply a driving signal to the touch panel 120 to drive the touch panel 120, may detect a sensing signal from the touch panel 120, and based on this, may sense a touch presence and/or a touch position (touch coordinates).

The touch sensing circuit TSC may include a touch driving circuit TDC for supplying the driving signal and receiving the sensing signal, and a touch controller T-CTR for calculating the presence of a touch and/or a touch position (touch coordinates).

The touch sensing circuit TSC may be implemented as one or more components (e.g., an integrated circuit), and may be implemented separately from the display driving circuit.

In addition, all or a part of the touch sensing circuit TSC may be implemented by being integrated with a display driving circuit or one or more of internal circuit thereof. For example, the touch driving circuit TDC of the touch sensing circuit TSC may be implemented as an integrated circuit together with the data driving circuit DDC of the display driving circuit.

Meanwhile, the touch display device 100 according to the embodiments of the present disclosure may sense a touch based on capacitance formed in the touch sensing electrodes 1B.

For example, the touch display device 100 according to the embodiments of the present disclosure may sense the touch by using, as a capacitance-based touch sensing method, a mutual-capacitance based touch sensing method and/or a self-capacitance based touch sensing method. However, in the following description, for convenience of explanation, the touch display device 100 according to the embodiments of the present disclosure will be mainly described with respect to a mutual-capacitance-based touch sensing method.

Figure 2:
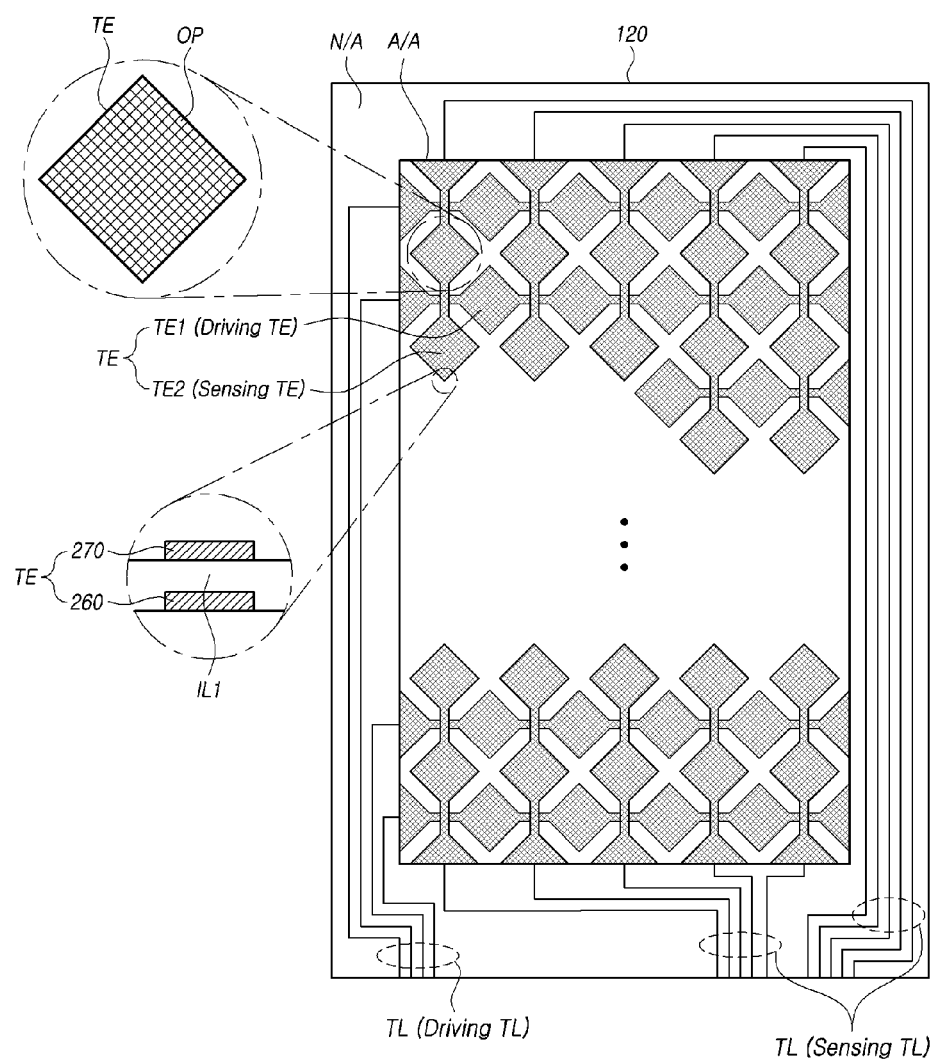
FIG. 2 schematically illustrates a structure of a touch panel including a plurality of touch sensing electrodes in a touch display device according to embodiments of the present disclosure.
Figure 3:
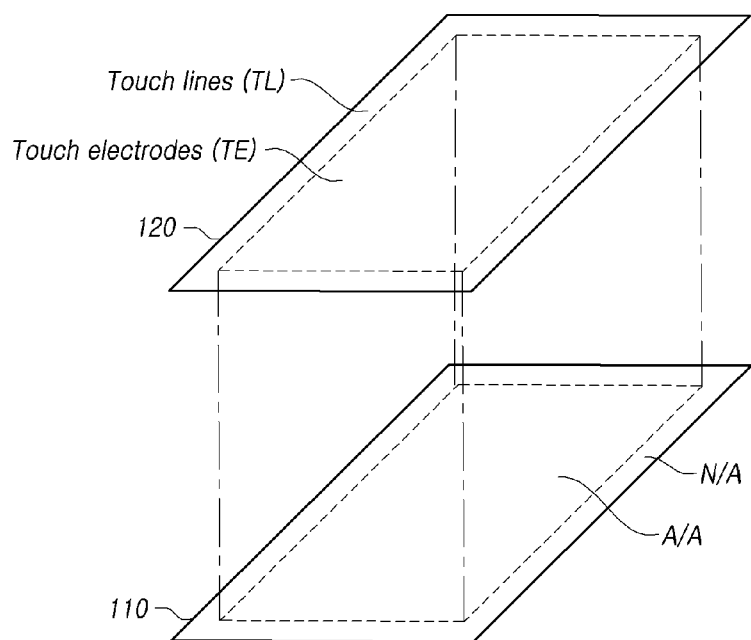
FIG. 3 illustrates an arrangement relationship between a display panel and a touch panel according to exemplary embodiments of the present disclosure.

FIG. 2 schematically illustrates a structure of a touch panel including a plurality of touch sensing electrodes in a touch display device according to embodiments of the present disclosure. FIG. 3 illustrates an arrangement relationship between a display panel and a touch panel according to exemplary embodiments of the present disclosure.

Referring to FIG. 2, a plurality of touch electrodes TE, are disposed on the touch panel 120, and touch lines TL for electrically connecting the touch electrodes TE, and a touch sensing circuit TSC may be disposed.

The plurality of touch electrodes TE, may be formed in a mesh shape including a plurality of openings OP.

In addition, in the touch panel 120, touch pads contacting the touch sensing circuit TSC may exist in order to electrically connect the touch lines TL and the touch sensing circuit TSC.

The touch electrodes TE, and the touch lines TL may be disposed on the same layer or on different layers.

Meanwhile, in the case that the above-described touch display device 100 utilizes the mutual-capacitance based touch sensing method, two or more touch electrodes TE, disposed in the same row (or the same column) may be electrically connected to form one driving touch electrode line. Two or more touch electrodes TE disposed in the same column (or same row) may be electrically connected to form one sensing touch electrode line.

In the example of FIG. 2, two or more touch electrodes TE, forming one driving touch electrode line may be integrated and electrically connected, and two or more touch electrodes TE, forming one sensing touch electrode line may also be integrated and electrically connected.

Here, two or more touch electrodes TE, forming one driving touch electrode line may be referred to as driving touch electrodes TE1. Two or more touch electrodes TE forming one sensing touch electrode line may be referred to as sensing touch electrodes TE2.

At least one touch line TL may be connected to each driving touch electrode line, and at least one touch line TL may be connected to each sensing touch electrode line.

At least one touch line TL connected to each driving touch electrode line may be referred to as a driving touch line TL. At least one touch line TL connected to each sensing touch electrode line may be referred to as a sensing touch line TL.

One touch pad may be connected to each one touch line TL.

Referring to FIG. 2, each of the plurality of touch electrodes TE, may have, for example, a rhombus outline, and in some cases, a rectangle shape (which may include a square), or it may be of various shapes.

The shape of the touch electrode TE, may be variously designed in consideration of the display performance and the touch performance of the touch display device 100.

The plurality of touch electrodes TE, disposed on the touch panel 120 may have a structure in which a first touch electrode 260 and a second touch electrode 270 disposed on different layers overlap each other with at least one insulating layer IL1 interposed therebetween.

The touch panel 120 illustrated in FIG. 2 is illustrated to be elongated in the column direction, but depending on the type (e.g., TV, monitor, mobile terminal, etc.) or design of the touch display device 100, it may be designed to be elongated in the row direction.

The touch panel 120 according to embodiments may disposed outside the display panel 110 (external type) or inside the display panel 110 (built-in type).

If the touch panel 120 is an external type, the touch panel 120 and the display panel 110 may be separately manufactured through different panel manufacturing processes and then bonded.

If the touch panel 120 is a built-in type, the touch panel 120 and the display panel 110 may be manufactured together through a single panel manufacturing process.

Referring to FIGS. 2 and 3, the display panel 110 may include an active area A/A on which an image is displayed and a non-active area N/A outside the active area A/A. Here, the active area A/A is also referred to as a display area, and the non-active area N/A is also referred to as a non-display area.

A plurality of subpixels defined by data lines and gate lines may be arranged in the active area A/A.

In the non-active area N/A, there may provided lines and pads for connecting data lines, gate lines and various signal lines in the active area A/A to the display driving circuit.

A plurality of touch electrodes 1 and a plurality of touch lines TL may be disposed on the touch panel 120.

The plurality of touch electrodes 1 may be positioned to correspond to the active area A/A of the display panel 110.

The plurality of touch lines TL may be positioned to correspond to the non-active area N/A of the display panel 110.

That is, the plurality of touch lines TL may exist outside the touch electrode area (active area A/A or a corresponding area thereof) in which the plurality of touch electrodes 1 are disposed.

The touch panel 120 may be built-in or external to the display panel 110.

As described above, since the touch electrodes TE, are disposed in the active area A/A of the display panel 110, and the touch lines are disposed in the non-active area N/A of the display panel 110, it is possible to provide touch sensing that matches the display state of the screen.

Further, referring to FIG. 2, each of the plurality of touch lines TL is electrically connected to the touch sensing circuit TSC.

Meanwhile, the structure of the electrodes included in the touch panel according to the embodiments of the present disclosure is not limited to the structure illustrated in FIG. 2.

Figure 4:
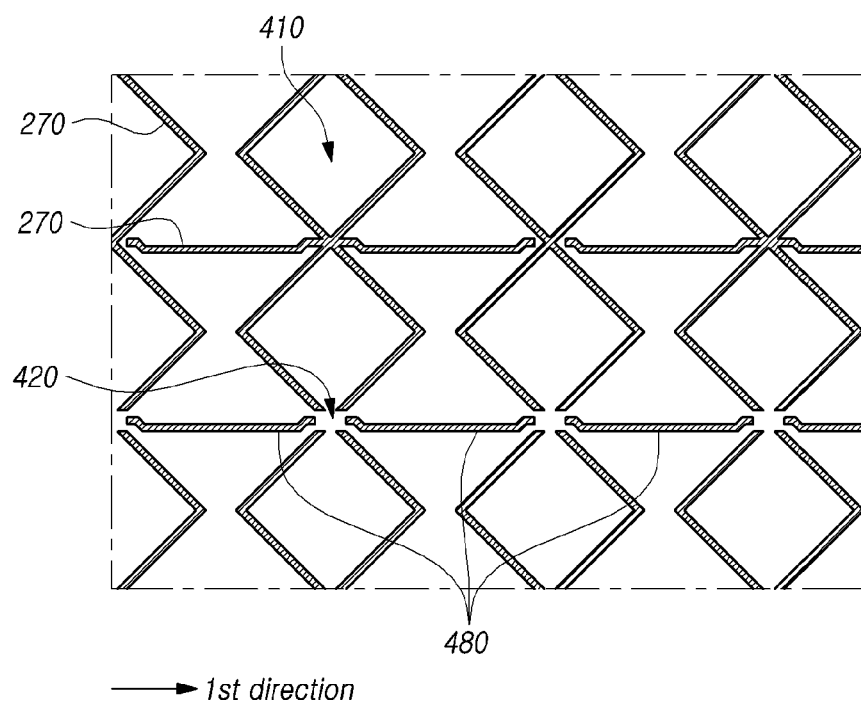
FIG. 4 schematically illustrates another arrangement structure of electrodes included in a touch panel according to embodiments of the present disclosure.

FIG. 4 schematically illustrates another arrangement structure of electrodes included in a touch panel according to embodiments of the present disclosure.

In the following description, content overlapping with the above-described embodiments may be omitted. In addition, in the following description, the same elements may be used for reference numerals overlapping those of the above-described embodiments.

Referring to FIG. 4, a touch panel 120 of the touch display device 100 may include a plurality of first touch electrodes 260 (or first touch electrodes) and a plurality of second touch electrodes 270. The touch panel 120 may be driven in a manner that senses the amount of change in capacitance formed between the first touch electrode 260 and the second touch electrode 270.

In addition, the first touch electrode 260 and the second touch electrode 270 may be disposed to overlap each other in at least a partial area of the touch panel 120.

A portion of the first touch electrode 260 and the second touch electrode 270 overlapping each other may extend in a first direction.

Also, other portions of the first touch electrode 260 and the second touch electrode 270 overlapping each other may extend in a second direction that intersects the first direction. In addition, the first touch electrode 260 and the second touch electrode 270 overlapping each other extending in the second direction may cross at least twice with the other first and second touch electrodes 260 and 270 overlapping each other extending in the second direction.

There may be provided an opening 410 between the crossing points of the first touch electrode 260 and the second touch electrode 270 overlapping each other and the other adjacent first touch electrode 260 and the second touch electrode. Accordingly, a plurality of openings 410 may exist in the touch panel 120.

Here, the plurality of openings 410 may be formed by the first and second touch electrodes 260 and 270 intersecting different first and second touch electrodes 260 and 270.

However, the structure of the present disclosure is not limited thereto, and some of the plurality of openings 410 may be formed by a region in which at least two first touch electrodes 260 cross each other, or by a region in which at least two second touch electrodes 270 cross each other.

In a plan view, the shape of the plurality of openings 410 may be a rhombus or a diamond shape. However, the shapes of the plurality of openings 410 according to embodiments of the present disclosure are not limited thereto, and may be implemented by various shapes such as polygonal, elliptical, or circular shape.

In addition, the touch panel 120 may include at least one disconnection portion 420.

The disconnection portion 420 may be a region in which at least one of the first touch electrode 260 and the second touch electrode 270 is disconnected from the adjacent other first touch electrode 260 or the second touch electrode 270.

For example, in the case that the entire first touch electrode 260 included in the touch panel 120 is electrically connected and the entire second touch electrode 270 is electrically connected, if a defect occurs in a portion of the first touch electrode 260 and a portion of the second touch electrode 270, the entire touch panel 120 may not operate.

However, in the present embodiment, by including the disconnection portion 420 which is a region in which at least one of the first touch electrode 260 and the second touch electrode 270 is disconnected, another second touch electrode 270 disconnected from the first touch electrode 260 or the second touch electrode 270 with the defect may be driven, thereby preventing or at least reducing the touch sensitivity of the touch panel 120 from being lowered.

In addition, in the case that the touch panel 120 includes a plurality of disconnection portions 420, the touch panel 120 may include at least one dummy pattern 480.

The dummy pattern 480 may be a part disconnected from the first touch electrode 260 or a part disconnected from the second touch electrode 270. In addition, the dummy pattern 480 may be a part in which each of the first touch electrode 260 and the second touch electrode 270 is cut off. In this case, the dummy pattern 480 may have a structure in which a portion of the first touch electrode 260 and a portion of the second touch electrode 270 overlap.

The position and shape of the dummy pattern 480 of FIG. 4 are only illustrated as an example, and the position and shape of the dummy pattern 480 may be modified in various ways.

Also, the ratio of the area occupied by the dummy pattern 480 (dummy pattern ratio) with respect to the size of one second touch electrode 270 or the first touch electrode 260 may be variously changed.

Meanwhile, in the case that, in the touch panel 120, the dummy pattern 480 does not exist and the plurality of first touch electrodes 260 and the plurality of second touch electrodes 270 are disposed to cross other first and second touch electrodes 260 and 270, there may be a visibility problem in which outlines of the first touch electrode 260 and the second touch electrode 270 are visible on the screen.

However, by disposing one or more dummy patterns 480 on the touch panel 120, a visibility problem in the case that the first touch electrode 260 and the second touch electrode 270 are patterned in a mesh shape is prevented or at least reduced.

In addition, by adjusting the presence or absence or number (dummy pattern ratio) of the dummy patterns 480 for each second touch electrode 270, the capacitance may be adjusted for each second touch electrode 270, thereby improving the touch sensitivity.

This touch panel 120 may be disposed on the display panel 110.

It will be described this configuration with reference to FIG. 5.

Figure 5:
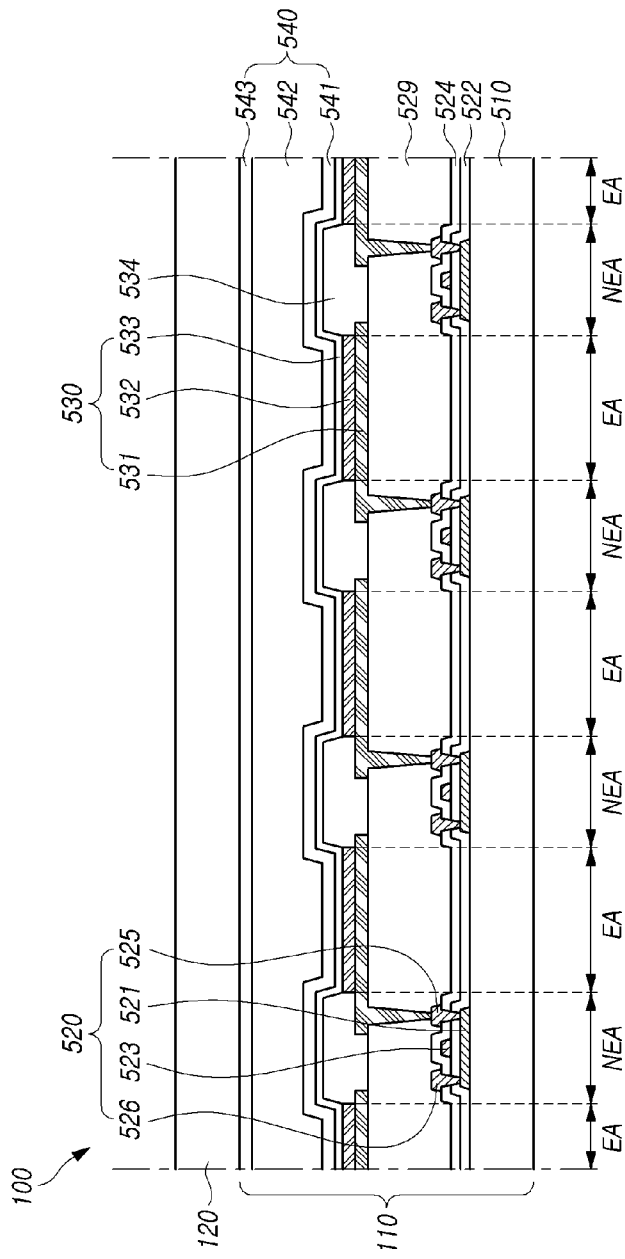
FIG. 5 illustrates a specific structure of an active area of a display panel of a touch display device and a structure of a touch panel disposed on the display panel according to embodiments of the present disclosure.

FIG. 5 illustrates a specific structure of an active area of a display panel of a touch display device and a structure of a touch panel disposed on the display panel according to embodiments of the present disclosure.

Referring to FIG. 5, a display panel 110 may include a substrate 510, a transistor 520, an electroluminescent device 530, and an encapsulation portion 540.

The substrate 510 may be made of a material having a bendable or foldable property.

For example, the substrate 510 may include a polymer resin such as polyethersulphone, polyacrylate, polyetherimide, polyethyelenen napthalate, polyethylene terephthalate, polyphenylene sulfide, polyallylate, polyimide, polycarbonate, photoacrylic or cellulose acetate propionate (CAP). However, the material of the substrate 510 according to the present disclosure is not limited thereto, and the substrate 510 may be formed of glass or an insulating metal thin film.

At least one transistor 520 may be disposed on the substrate 510. The transistor 520 of FIG. 5 may be a driving transistor electrically connected to the electroluminescent device 530.

The transistor 520 may include an active layer 521, a gate electrode 523, a source electrode 525 and a drain electrode 526.

Specifically, at least one active layer 521 may be disposed on the substrate 510.

Although not shown in the drawings, at least one buffer layer may be further disposed between the substrate 510 and the active layer 521.

A gate insulating layer 522 including an inorganic insulating material may be disposed on the active layer 521.

The gate electrode 523 may be disposed on the gate insulating layer 522. Although the configuration in which the gate electrode 523 is a single layer is illustrated in FIG. 5, the gate electrode 523 according to the present disclosure may have a multilayer structure of two or more layers.

An interlayer insulating layer 524 including an inorganic insulating material may be disposed on the gate electrode 523.

On the interlayer insulating layer 524, the source electrode 525 and the drain electrode 526 may be disposed to be spaced apart from each other. Although FIG. 5 illustrates a configuration in which the source electrode 525 and the drain electrode 526 are a single layer, the structure of the source electrode 525 and the drain electrode 526 according to the present disclosure is not limited thereto. The source electrode 525 and the drain electrode 526 may have a multilayer structure of two or more layers.

Each of the source electrode 525 and the drain electrode 526 may be in contact with the active layer 521 through a contact hole provided in the interlayer insulating layer 524 and the gate insulating layer 522.

A planarization layer 529 including an organic insulating material may be disposed on the source electrode 525 and the drain electrode 526.

Although not shown in the drawings, a protective layer including an inorganic insulating material may be further disposed between the source electrode 525 or the drain electrode 526 and the planarization layer 529.

The electroluminescent device 530 may include a first electrode 531, a light emitting layer 532, and a second electrode 533. Here, the first electrode 531 may be an anode of the electroluminescent device 530, and the second electrode 533 may be a cathode of the electroluminescent device 530. However, the configuration of the present disclosure is not limited thereto, and the first electrode 531 may be a cathode of the electroluminescent device 530, and the second electrode 533 may be an anode of the electroluminescent device 530.

However, in the following description, for convenience of description, it will be described a configuration in which the first electrode 531 of the electroluminescent device 530 is an anode and the second electrode 533 of the electroluminescent device 530 is a cathode.

In the active area A/A of the display panel 110, a plurality of first electrodes 531 may be disposed on the planarization layer 529 to be spaced apart from each other.

In addition, each of the first electrodes 531 may be electrically connected to the source electrode 525 of one transistor 520 through a contact hole provided in the planarization layer 529.

Meanwhile, although FIG. 5 illustrates a structure in which the first electrode 531 of the electroluminescent device 530 is connected to the source electrode 525 of the transistor 520, the structure according to the present disclosure is limited thereto. The first electrode 531 may be connected to the drain electrode 526 of the transistor 520.

A bank 534 may be disposed on a portion of the upper surface of the first electrode 531 and a portion of the upper surface of the planarization layer 529.

The bank 534 may define a light emission area EA and a non-emission area NEA in the active area A/A of the display panel 110. Specifically, in the active area A/A, an area in which the bank 534 is disposed may correspond to the non-emission area NEA, and an area in which the bank 534 is not disposed may correspond to the light emission area EA.

The light emitting layer 532 may be disposed on an upper surface of the first electrode 531 that does not overlap the bank 534. The light emitting layer 532 may have a structure of a single layer or a double layer or more. For example, the light emitting layer 532 may be configured to further include a hole transport layer, an electron transport layer, and the like. The light emitting layer 532 may include a light emitting material corresponding to the color of each subpixel in order to display a unique color of each subpixel included in the active area A/A.

In the case that the light emitting layer 532 is an organic material, the electroluminescent device 530 may be referred to as an organic light emitting diode (OLED), and if the light emitting layer 532 is an inorganic material, the electroluminescent device 530 may be referred to as an inorganic light emitting diode. For example, in the case that an inorganic light emitting diode is formed using a quantum-dot material, the electroluminescent device 530 may be referred to as a quantum-dot light emitting diode.

The light emitting layer 532 may be individually disposed according to a unique color of each subpixel. However, the configuration of the light emitting layer 532 according to the present disclosure is not limited thereto, and if the color of all subpixels is white, the light emitting layer may be formed as a common layer. The common layer may mean a layer disposed in all areas of the active area A/A.

The second electrode 533 may be disposed on the light emitting layer 532 and the bank 534.

The second electrode 533 may be disposed to overlap the plurality of first electrodes 531 disposed in the active area A/A. In other words, the first electrodes 531 disposed in the active region A/A may have a structure in which one second electrode 533 is shared.

The encapsulation portion 540 capable of preventing or at least reducing moisture or foreign substances from penetrating into the electroluminescent device 530 may be disposed on the second electrode 533. The encapsulation portion 540 may include at least two encapsulation layers including an inorganic insulating material and at least one encapsulation layer including an organic insulating material.

Specifically, the encapsulation portion 540 may include a first encapsulation layer 541, a second encapsulation layer 542, and a third encapsulation layer 543.

The first encapsulation layer 541 may be disposed on the second electrode 533, and may include an inorganic insulating material.

The second encapsulation layer 542 may be disposed on the first encapsulation layer 541, and may include an organic insulating material.

The third encapsulation layer 543 may be disposed on the second encapsulation layer 542, and may include an inorganic insulating material.

The touch panel 120 may be disposed on the third encapsulation layer 543.

The touch panel 120 may be attached on the third encapsulation layer 543 through an adhesive insulating film.

In the case that the external light is incident on the touch display device 100 including the touch panel 120, the external light incident on the touch panel 120 is reflected by a plurality of electrodes or lines in the display panel 110, and it may be recognized by the user as a stain.

In particular, in the case that the touch display device 100 is viewed from a lateral direction (e.g., a direction other than a direction perpendicular to the surface of the touch panel), the external light reflected by the display panel 110 of the touch display device 100 may be refracted in components included in the touch panel 120, so that there may be greatly lowered the visibility of the touch display device.

Accordingly, the embodiments of the present disclosure may provide a touch panel having excellent visibility even when a user views the touch display device 100 from the side.

Figure 6:
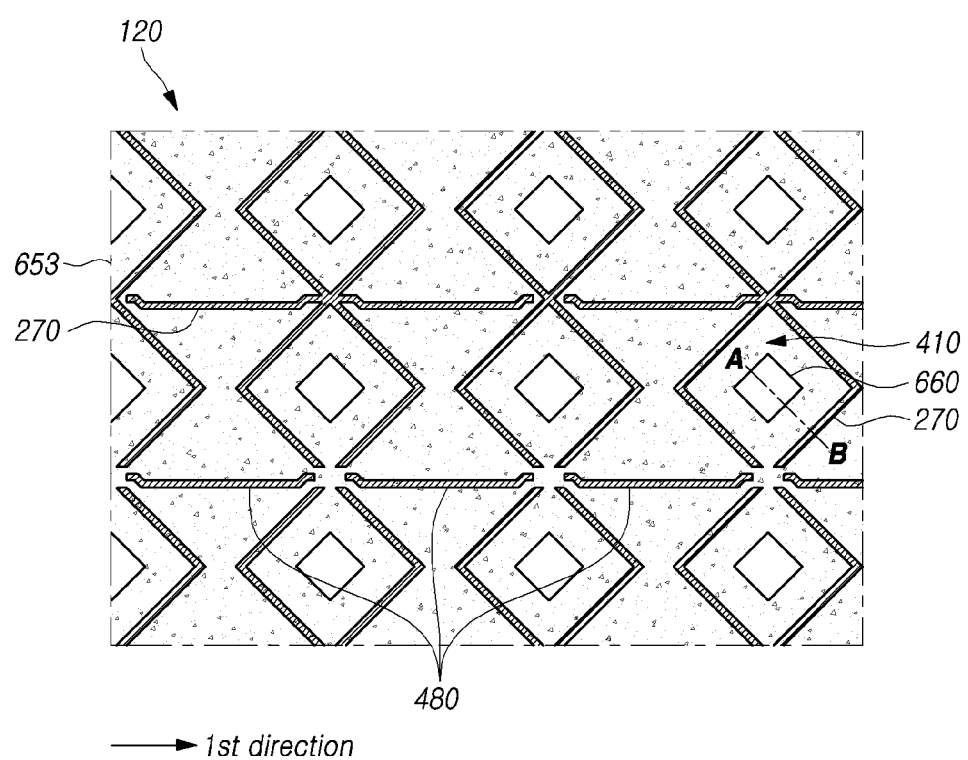
FIG. 6 is a plan view schematically illustrating a structure of a touch panel according to a first embodiment of the present disclosure.
Figure 7:
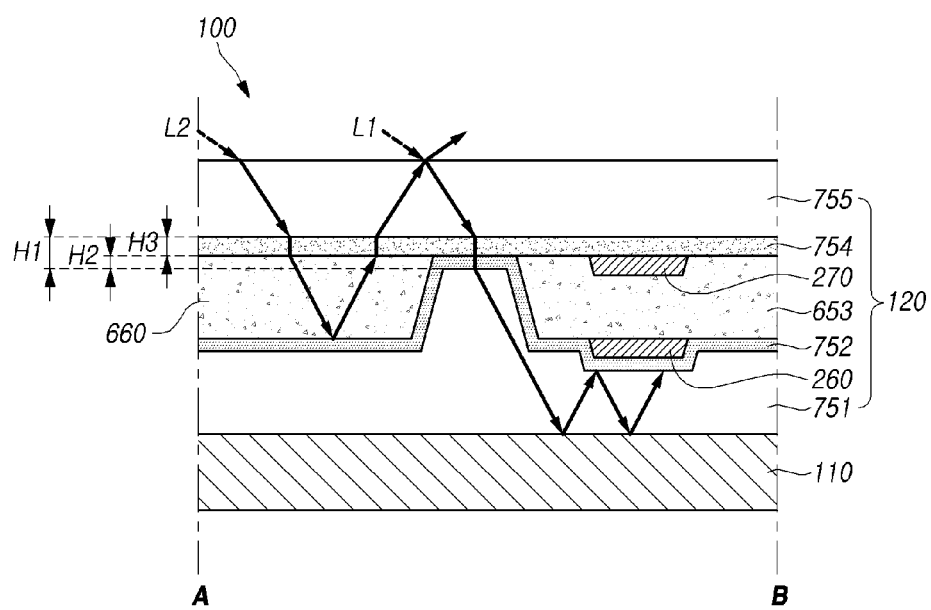
FIG. 7 is a cross-sectional view along line A-B of FIG. 6 according to the first embodiment of the present disclosure.

FIG. 6 is a plan view schematically illustrating a structure of a touch panel according to a first embodiment of the present disclosure. FIG. 7 is a cross-sectional view along line A-B of FIG. 6 according to the first embodiment of the present disclosure.

In describing the present embodiment, descriptions of the same or corresponding components as in the previous embodiment will be omitted. Hereinafter, it will be described the touch panel 120 according to the present embodiment with reference to this.

Meanwhile, in the following description, the structure of the touch panel 120 shown in FIG. 4 will be mainly described, but the structural features according to the embodiments of the present disclosure may also be applied to the touch panel 120 of FIG. 2.

That is, the touch panel according to the embodiment of the present disclosure with reference to FIG. 6 may include a plurality of first touch electrodes 260, a plurality of second touch electrodes 270, a plurality of openings 410, and a plurality of dummy patterns 480.

For example, first touch electrodes 260, second touch electrodes 270, openings 410, and dummy patterns 480 included in the touch panel 120 of the embodiment according to FIG. 6. may be the same as the first touch electrode 260, the second touch electrode 270, the opening 410, and the dummy pattern 480 described with reference to FIG. 4.

The touch panel 120 according to the present embodiment may include a plurality of insulating layers. In addition, at least one of the plurality of insulating layers may include a first hole 660.

Specifically, at least one first hole 660 of the at least one insulating layer 653 among the plurality of insulating layers may be provided in a region overlapping the opening 410.

As shown in FIG. 6, one first hole 660 may be disposed to correspond to one opening 410.

In a plan view, an area of one first hole 660 may be smaller than an area of one opening 410.

If the area of the one first hole 660 is larger than the area of the one opening 410, the corresponding hole may overlap at least a portion of the first touch electrode 260 and/or the second touch electrode 270 defining the opening 410 overlapping the first hole 660.

In the case that touch electrode overlaps the first hole 660, the first touch electrode 260 and/or the second touch electrode 270 may be exposed to the outside, or the first touch electrode 260 and/or the second touch electrode 270 may be not formed on the flat surface, so that the reliability may be deteriorated.

In particular, in the case that the thickness of the first touch electrode 260 and the second touch electrode 270 is formed to be thin, process reliability may be deteriorated due to the step caused by the first hole 660, and a process error may occur. Therefore, since the first touch electrode 260 and the second touch electrode 270 may be not properly formed, the touch reliability may also be deteriorated.

Although not shown in the drawing, if the first and second touch electrodes are arranged in a mesh type as in the structure of FIG. 2, the first hole 660 of the insulating layer 653 may be disposed in a region overlapping the opening OP of FIG. 2.

Meanwhile, although FIG. 6 illustrates a structure in which one first hole 660 is disposed to correspond to one opening 410, the present disclosure is not limited thereto.

For example, two or more first holes 660 may be provided to correspond to one opening 410, and in this case, each of the two or more first holes 660 may not overlap the first touch electrode 260 and/or the second touch electrode 270.

Specifically, referring to FIG. 7, the touch panel 120 may be disposed on the display panel 110.

The touch panel 120 may include a first low refractive layer 751, a first high refractive layer 752, a first touch electrode 260, a second low refractive layer 653, a second touch electrode 270, a second high refractive layer 754 and a third low refractive layer 755.

The first low refractive layer 751 of the touch panel 120 may be disposed on one surface of the display panel 110, and a first high refractive layer 752 may be disposed on the first low refractive layer 751. In addition, a plurality of first touch electrodes 260 may be disposed on the first high refractive layer 752, and the second low refractive layer 653 (the insulating layer 653 of FIG. 6) may be disposed on the plurality of first touch electrodes 260. The plurality of second touch electrodes 270 may be disposed on the second low refractive layer 653, and the second high refractive layer 754 may be disposed on the plurality of second touch electrodes 270. Also, the third low refractive layer 755 may be disposed on the second high refractive layer 754.

Here, the refractive index of the first to third low refractive layers 751, 653, and 755 may be smaller than the refractive index of the first and second high refractive layers 752 and 754.

Specifically, the first low refractive layer 751 of the touch panel 120 may be disposed on one surface of the display panel 110. For example, the first low refractive layer 751 may be disposed on one surface of the display panel 110 viewed by the user.

The refractive index of the first low refractive layer 751 may be 1.4 to 1.5, but the refractive index of the first low refractive layer 751 of the present disclosure is not limited thereto.

In this case, the first low refractive layer 751 may include an organic insulating material. The organic insulating material of the first low refractive layer 751 may include an adhesive material. For example, the first low refractive layer 751 may be an optical clear resin (OCR) or an optically clear adhesive (OCA), but material of the first low refractive layer 751 according to the present disclosure is not limited thereto.

The first high refractive layer 752 may be disposed on the first low refractive layer 751.

The refractive index of the first high refractive layer 752 may be 2 to 2.2, however, the refractive index of the first high refractive layer 752 is not limited thereto.

Here, the first high refractive layer 752 may include an inorganic insulating material. For example, the first high refractive layer 752 may include any one of silicon oxide (SiOx), silicon nitride (SiNx), and silicon oxynitride (SiON), but a material of the first high refractive layer 752 according to the present disclosure is not limited thereto.

The first touch electrode 260 may be disposed on the first high refractive layer 752.

FIG. 7 illustrates a structure in which one first touch electrode 260 is disposed on the first high refractive layer 752, however, a plurality of first touch electrodes 260 may be disposed on the first high refractive layer 752. In addition, although the structure of the first touch electrode 260 is illustrated in FIG. 7 as a single layer, the first touch electrode may also have a multilayer structure of two or more layers.

The first touch electrode 260 may include an opaque or translucent conductive material.

For example, the first touch electrode 260 may include at least one of silver (Ag), aluminum (Al), magnesium (Mg), chromium (Cr), titanium (Ti), nickel (Ni), tungsten (W), gold (Au), tantalum (Ta), copper (Cu), cobalt (Co), iron (Fe), molybdenum (Mo), or platinum (Pt). In this case, the first touch electrode 260 may be disposed to overlap the bank 534 of the display panel 110 described with reference to FIG. 5.

As another example, the first touch electrode 260 may include a transparent conductive material, and may include at least one transparent conductive oxide such as indium tin oxide (ITO), indium zinc oxide (IZO), aluminum zinc oxide (AZO), gallium doped zinc oxide (GZO), zinc tin oxide (ZTO), gallium tin oxide (GTO), or fluorine doped tin oxide (FTO).

The second low refractive layer 653 may be disposed on the first high refractive layer 752 and the first touch electrode 260.

The refractive index of the second low refractive layer 653 may be 1.4 to 1.5, however, the refractive index of the second low refractive layer 653 of the present disclosure is not limited thereto.

The second low refractive layer 653 may include an organic insulating material. For example, the second low refractive layer 653 may include an acrylic organic insulating material (e.g., photoacrylic), or may include at least one of polystyrene, polymethylmethacrylate (PMMA), polyacrylonitrile (PAN), polyamide (PA), polyimide (PI), polyarylether (PAE), heterocyclic polymer, parylene, epoxy resin, benzocyclobutene (BCB), a siloxane-based resin, and a silane-based resin.

The second touch electrode 270 overlapping the first touch electrode 260 may be disposed on the second low refractive layer 653. FIG. 7 illustrates a structure in which one second touch electrode 270 is disposed on the second low refractive layer 653, however, a plurality of second touch electrodes 270 may be disposed on the second low refractive layer 653. In addition, although FIG. 7 illustrates the structure in which the second touch electrode 270 is a single layer, the second touch electrode 270 may be formed in a multilayer structure of two or more layers.

The second touch electrode 270 may overlap the first touch electrode 260. For example, one end of the second touch electrode 270 may overlap one end of the first touch electrode 260, and the other end of the second touch electrode 270 may overlap the other end of the first touch electrode 260. Through such a structure, the deterioration of image quality and/or deterioration of touch sensitivity due to touch noise or the like is prevented or at least reduced.

The second touch electrode 270 may include an opaque or translucent conductive material.

For example, the second touch electrode 270 may include at least one metal of silver (Ag), aluminum (Al), magnesium (Mg), chromium (Cr), titanium (Ti), nickel (Ni), tungsten (W), gold (Au), tantalum (Ta), copper (Cu), cobalt (Co), iron (Fe), molybdenum (Mo), or platinum (Pt). In this case, the second touch electrode 270 may be disposed to overlap the bank 534 of the display panel 110 described with reference to FIG. 5.

As another example, the second touch electrode 270 may include a transparent conductive material, and may include at least one transparent conductive oxide such as indium tin oxide (ITO), indium zinc oxide (IZO), aluminum zinc oxide (AZO), gallium doped zinc oxide (GZO), zinc tin oxide (ZTO), gallium tin oxide (GTO), or fluorine doped tin oxide (FTO).

In the case that the first and second touch electrodes 260 and 270 include an opaque or translucent conductive material, the resistance of each touch electrode may be lowered, so that the large-area touch panel 120 can be implemented.

In addition, in the case that the first and second touch electrodes 260 and 270 include a transparent conductive material, there may be improved the transmittance of the touch panel 120.

The second high refractive layer 754 may be disposed on the second low refractive layer 653 and the second touch electrode 270.

The refractive index of the second high refractive layer 754 may be 2 to 2.2, however, the refractive index of the second high refractive layer 754 is not limited thereto.

Here, the second high refractive layer 754 may include an inorganic insulating material. For example, the second high refractive layer 754 may include any one of silicon oxide (SiOx), silicon nitride (SiNx), and silicon oxynitride (SiON), however, the material of the second high refractive layer 754 according to the present disclosure is not limited thereto.

The third low refractive layer 755 may be disposed on the second high refractive layer 754.

The refractive index of the third low refractive layer 755 may be 1.4 to 1.5, but the refractive index of the third low refractive layer 755 of the present disclosure is not limited thereto.

The third low refractive layer 755 may include an organic insulating material. For example, the third low refractive layer 755 may include an acrylic organic insulating material (e.g., photoacrylic), polystyrene, or may include at least one of polymethylmethacrylate (PMMA), polyacrylonitrile (PAN), polyamide (PA), polyimide (PI), polyarylether (PAE), heterocyclic polymer, parylene, epoxy resin, benzocyclobutene (BCB), a siloxane-based resin, or a silane-based resin.

Meanwhile, as shown in FIG. 7, the second low refractive layer 653 may include at least one first hole 660.

The first hole 660 may not overlap the first touch electrode 260 and the second touch electrode 270. In the case that the first touch electrode 260 and the second touch electrode 270 overlap at least a portion of the first hole 660, there may occur a step in at least one of the first touch electrode 260 and the second touch electrode 270, thereby generating touch noise such as a decrease in touch sensitivity.

The first hole 660 may be disposed to expose a portion of the lower surface of the second high refractive layer 754.

The first high refractive layer 752 and the first low refractive layer 751 may be disposed in the first hole 660 of the second low refractive layer 653.

In addition, the first high refractive layer 752 may be in contact with a portion of the lower surface of the second high refractive layer 754 exposed by the first hole 660 in the second low refractive layer 653.

In other words, in the region where the first hole 660 of the second low refractive layer 653 is disposed, there may be sequentially stacked the first high refractive layer 752 and the second high refractive layer 754 which have a higher refractive index than each of the first to third low refractive layers 751, 653, and 755.

Accordingly, in the region where the first hole 660 of the second low refractive layer 653 is disposed, the thickness H1 of the high refractive layers may be large compared to the region in which the first hole 660 of the second low refractive layer 653 is not disposed.

Specifically, in the region where the first hole 660 of the second low refractive layer 653 is disposed, the thickness of the high refractive layers in contact with each other may correspond to the sum of the thickness H2 of the first high refractive layer 752 and the thicknesses H3 of the second high refractive layers 754. On the other hand, in the region where the first hole 660 of the second low refractive layer 653 is not disposed, since the first high refractive layer 752 and the second high refractive layer 754 are spaced apart from each other with the second low refractive layer 653 interposed therebetween, they cannot be placed in contact with each other.

Meanwhile, although not shown in the drawings, the touch panel 120 may be manufactured by forming a third low refractive layer 755 on a substrate, forming a second high refractive layer 754 on the third low refractive layer 755, forming a plurality of second touch electrodes 270 on the second high refractive layer 754, and forming a second low refractive layer 653 including at least one first hole 660 on the substrate on which the plurality of second touch electrodes 270 are formed. Then, a plurality of first touch electrodes 260 are formed on the second low refractive layer 653 including at least one first hole 660, and then, the first high refractive layer 752 and the first low refractive layer 751 are sequentially formed on the substrate on which the first touch electrode 260 is formed, so that the touch panel 120 may be formed.

Thereafter, the substrate disposed on one surface of the third low refractive layer 755 may be removed and the first low refractive layer 751 may be attached to one surface of the display panel 110, so that the touch display device 100 may be formed.

Accordingly, the first hole 660 of the second low refractive layer 653 may be disposed to expose a portion of the lower surface of the second high refractive layer 754 of the touch display device 100, and the first high refractive layer 752 and the first low refractive layer 751 disposed under the second low refractive layer 653 may be disposed in the first hole 660.

As described above, the touch panel 120 according to the embodiment of the present disclosure includes the first hole 660 in the second low refractive layer 653 through which at least two high refractive layers (e.g., the first and second high refractive layers) can be in contact, thereby preventing or at least reducing side visibility from being deteriorated by the external light L1.

Specifically, a part of the external light L1 passes through the third low refractive layer 755 of the touch display device 100 and may be incident on the second high refractive layer 754 and the first high refractive layer 752 disposed in the first hole 660 of the second low refractive layer 653.

The external light L1 incident on the first hole 660 of the second low refractive layer 653 may be refracted and incident on the second high refractive layer 754 due to a difference in refractive index between the third low refractive layer 755 and the second high refractive layer 754. In this case, an incident angle of the external light L1 incident on the second high refractive layer 754 may be smaller than an incident angle of the external light L1 incident on the third low refractive layer 755.

The external light L1 may sequentially pass through the second high refractive layer 754 and the first high refractive layer 752 in the first hole 660. Here, since the refractive index of each of the second high refractive layer 754 and the first high refractive layer 752 correspond to or are similar to each other, there may hardly occur the refraction when the external light L1 is incident from the second high refractive layer 754 to the first high refractive layer 752.

In addition, the external light L1 may pass through the first high refractive layer 752 and then be incident on the first low refractive layer 751. In this case, due to the difference in refractive index between the first high refractive layer 752 and the first low refractive layer 751, the external light L1 may be refracted at the interface between the first high refractive layer 752 and the first low refractive layer 751, and then may be incident on the first low refractive layer 751. In this case, an incident angle of the external light L1 incident on the first low refractive layer 751 may be greater than an incident angle of the external light L1 incident on the first high refractive layer 752.

Thereafter, the external light L1 may pass through the first low refractive layer 751 to reach the display panel 110. In addition, the external light L1 may be reflected by the plurality of electrodes and the plurality of lines included in the display panel 110, and may be incident on the first low refractive layer 751 again.

The external light L1 may pass through the first low refractive layer 751 to reach the first high refractive layer 752. In this case, due to the difference in refractive index between the first low refractive layer 751 and the first high refractive layer 752, the external light L1 may be totally reflected at the interface between the first low refractive layer 751 and the first high refractive layer 752. Specifically, the external light L1 incident on the first high refractive layer 752 may be incident at an angle greater than the total reflection critical angle, and may be totally reflected at the interface between the first high refractive layer 752 and the first low refractive layer 751.

The external light L1 totally reflected at the interface between the first high refractive layer 752 and the first low refractive layer 751 may reach the display panel 110, and may be re-reflected by the plurality of electrodes and the plurality of lines of the display panel 110 and may be incident on the first low refractive layer 751 again.

As described above, since the external light L1 passing through the first and second high refractive layers 752 and 754 disposed in the first hole 660 of the second low refractive layer 653 is trapped in the touch panel 120 and is not emitted to the outside, the stain caused by the external light L1 may not be visually recognized by the user.

On the other hand, most of the external light L2 that does not pass through the first hole 660 in the second low refractive layer 653 among the external light incident on the touch display device 100 may sequentially pass through the third low refractive layer 755, the second high refractive layer 754, and the second low refractive layer 653, and may be reflected at the interface between the second low refractive layer 653 and the first high refractive layer 752 to be emitted to the outside of the touch panel 120.

Specifically, since the components having different refractive indices are alternately disposed, the external light L2 passing through each component may be incident on at least one component (e.g., the first high refractive layer 752) with an incident angle greater than a total reflection critical angle, and the external light L2 may be totally reflected and emitted to the outside of the touch panel 120.

In addition, a part of the external light L2 that does not pass through the first hole 660 provided in the second low refractive layer 653 may be reflected by the display panel 110 and emitted to the outside of the touch panel 120.

In this case, the external light L2 may be visually recognized by the user as a stain, and may be a factor of lowering the visibility of the touch display device 100. In particular, since the amount of external light L2 emitted in the lateral direction of the touch panel 120 (directions other than the direction perpendicular to the surface of the touch panel 120) increases, there may be lowered the side visibility of the touch display device 100.

However, in the embodiment of the present disclosure, the second low refractive layer 653 of the touch panel 120 includes at least one first hole 660, and in the first hole 660, the first high refractive layer 752 and the second high refractive layer 754 having a higher refractive index than the first to third low refractive layers 751, 653 and 755 are sequentially stacked. Accordingly, the external light L1 incident in the side direction of the touch panel 120 is trapped inside the touch panel 120, so that there may provide an effect of improving side visibility of the touch display device 100.

In addition, in the embodiment of the present disclosure, there may be reduced the number of the refraction of the external light L1 generated due to the difference in refractive index of the layers adjacent to each other by using the first hole 660 provided in the second low refractive layer 653. Accordingly, even if some of the external light L1 passing through the first and second high refractive layers 752 and 754 disposed in the first hole 660 is emitted to the outside of the touch panel 120, the external light L1 may not spread widely and can be focused and emitted. Accordingly, there may provide an effect that the non-uniformity caused by the external light L1 is very small, thereby improving the visibility.

Figure 8:
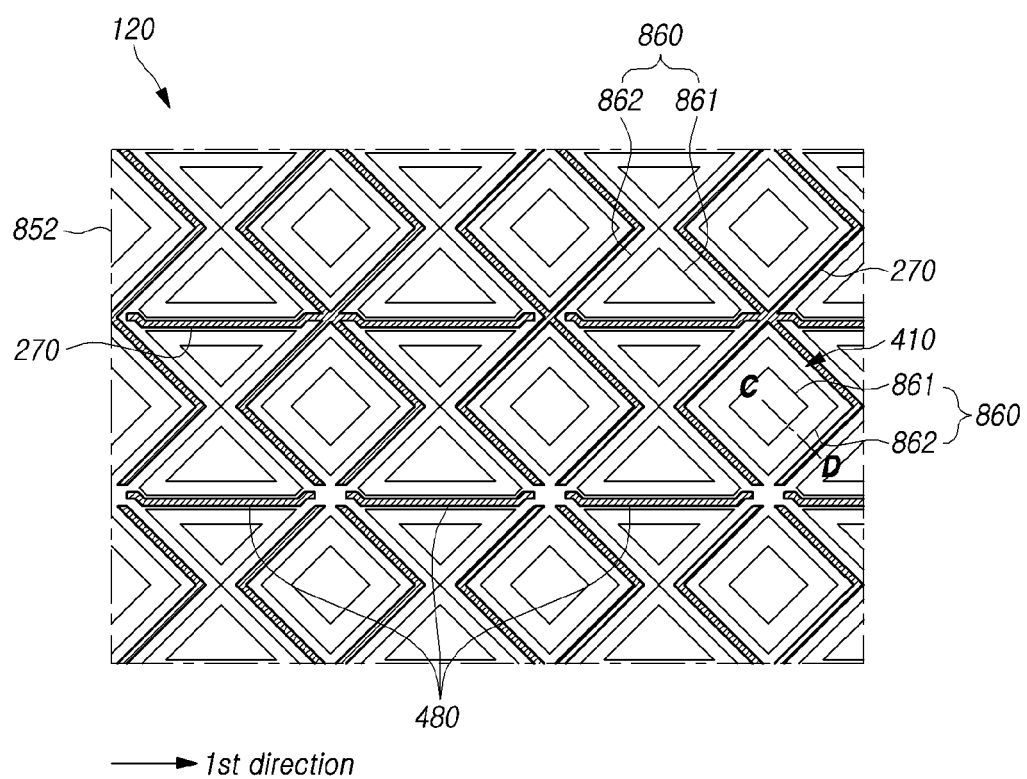
FIG. 8 is a plan view schematically illustrating a structure of a touch panel according to a second embodiment of the present disclosure.
Figure 9:
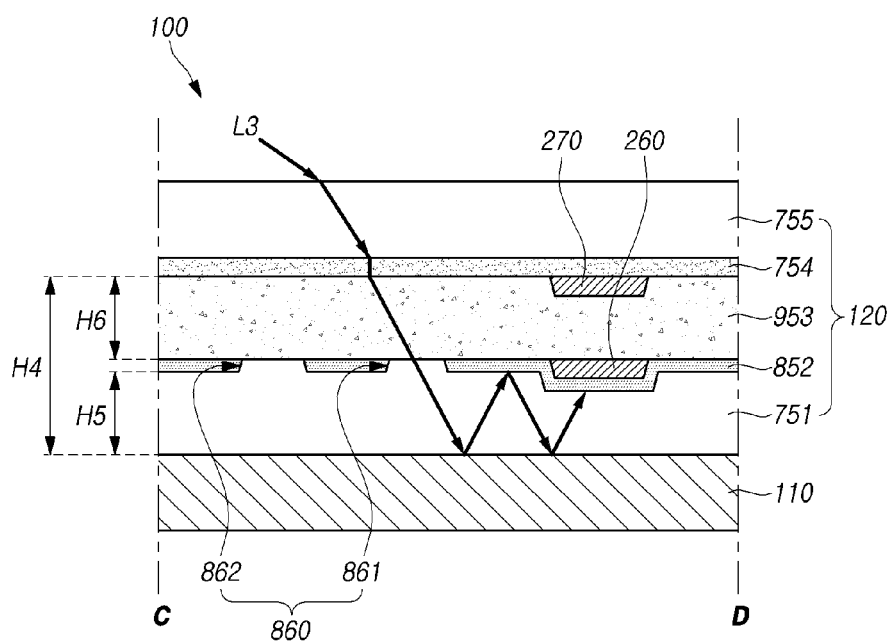
FIG. 9 is a cross-sectional view along line C-D of FIG. 8 according to the second embodiment of the present disclosure.

FIG. 8 is a plan view schematically illustrating a structure of a touch panel according to a second embodiment of the present disclosure. FIG. 9 is a cross-sectional view along line C-D of FIG. 8 according to the second embodiment of the present disclosure.

In describing the present embodiment, descriptions of the same or corresponding components as in the previous embodiment will be omitted. Hereinafter, it will be described the touch panel 120 according to the present embodiment with reference to FIGS. 8 and 9.

Referring to FIG. 8, the touch panel 120 according to the embodiment of the present disclosure may include a plurality of first touch electrodes 260, a plurality of second touch electrodes 270, a plurality of openings 410, and a plurality of dummy patterns 480.

For example, with reference to FIG. 8, the first touch electrodes 260, the second touch electrodes 270, the openings 410, and the dummy patterns 480 included in the touch panel 120 of the present embodiment may be the same as the first touch electrode 260, the second touch electrode 270, the opening 410, and the dummy pattern 480 described with reference to FIG. 4.

The touch panel 120 according to the present embodiment may include a plurality of insulating layers. In addition, at least one insulating layer 852 among the plurality of insulating layers may include a second hole 860.

Specifically, at least one of the plurality of insulating layers may include at least one second hole 860 provided in a region overlapping the opening 410. Here, the second hole 860 may include a first pattern hole 861 and a second pattern hole 862 which is spaced apart from the first pattern hole 861 and surrounds the first pattern hole 861.

In addition, the second hole 860 may be disposed at a region between the touch electrodes crossing each other and the other adjacent touch electrodes crossing each other (or a region between one opening 410 and another opening 410 adjacent in the first direction).

Here, each of the first pattern hole 861 and the second pattern hole 862 may have a closed curved shape in plan view.

In the case that each of the first and second pattern holes 861 and 862 is disposed in a region overlapping the opening 410, and the shape of the opening 410 by the first and second touch electrodes 260 and 270 is a rhombus shape, the first and second pattern holes 861 and 862 may also have a rhombus shape. That is, the shape of the first and second pattern holes 861 and 862 may correspond to the shape of the opening 410, however, the embodiment of the present disclosure is not limited thereto, and the shape of the first and second pattern holes 861 and 862 may be changed to various shapes.

In addition, in the case that each of the first and second pattern holes 861 and 862 is disposed at a region between the touch electrodes crossing each other and the other adjacent touch electrodes crossing each other, the first and second pattern holes 861 and 862 may have a triangular shape, but the embodiment of the present disclosure is not limited thereto, and the first and second pattern holes 861 and 862 may be changed into various shapes.

In addition, in the touch panel 120, the first and second pattern holes 861 and 862 may have different shapes depending on the positions of the first and second pattern holes 861 and 862.

The second hole 860 including the first and second pattern holes 861 and 862 may not overlap the first touch electrode 260 and the second touch electrode 270.

In the case that the second hole 860 overlaps the first touch electrode 260 and/or the second touch electrode 270, the first touch electrode 260 and/or the second touch electrode 270 may be exposed to the outside, or the first touch electrode 260 and/or the second touch electrode 270 may be not formed on the flat surface, so that the touch reliability may be lowered.

Although not shown in the drawings, in the case that the first and second touch electrodes are arranged in a mesh type as in the structure of FIG. 2, the second hole 860 of the insulating layer 852 may be disposed in an area overlapping the opening OP of FIG. 2.

Meanwhile, in FIG. 8, the second hole 860 has been mainly described as having a structure including the first pattern hole 861 and the second pattern hole 862, but the embodiment of the present disclosure is limited thereto. However, the second hole 860 may be a structure including one or three or more holes.

Specifically, referring to FIG. 9, the touch panel 120 may be disposed on the display panel 110.

The touch panel 120 may include first to third low refractive layers 751, 953 and 755, and first and second high refractive layers 852 and 754. Here, the refractive indices of the first to third low refractive layers 751, 953 and 755 may be less than the refractive indices of the first and second high refractive layers 852 and 754.

The first low refractive layer 751 of the touch panel 120 may be disposed on the display panel 110, and the first high refractive layer 852 (the insulating layer 852 of FIG. 8) may be disposed on the first low refractive layer 751.

The first high refractive layer 852 may include at least one second hole 860. Here, the second hole 860 may include a first pattern hole 861 and a second pattern hole 862 that are spaced apart from each other.

The first touch electrode 260 may be disposed on the first high refractive layer 852.

The first touch electrode 260 may not overlap the first pattern hole 861 and the second pattern hole 862.

The second low refractive layer 953 may be disposed on the first high refractive layer 852 on which the first touch electrode 260 is disposed.

The second touch electrode 270 may be disposed on the second low refractive layer 953.

The second high refractive layer 754 and the third low refractive layer 755 may be sequentially disposed on the second low refractive layer 953 on which the second touch electrode 270 is disposed.

Meanwhile, each of the first pattern hole 861 and the second pattern hole 862 of the first high refractive layer 852 may be disposed to expose a portion of the lower surface of the second low refractive layer 953. In addition, a first low refractive layer 751 may be disposed in the first pattern hole 861 and the second pattern hole 862.

In other words, the first low refractive layer 751 may be in contact with a portion of the lower surface of the second low refractive layer 953 through the first and second pattern holes 861 and 862.

Accordingly, in the region where the first and second pattern holes 861 and 862 of the first high refractive layer 852 are disposed, there may sequentially stacked the first and second low refractive layers 751 and 953 having a refractive index less than that of the first high refractive layer 852 and having refractive indices similar or identical to each other.

Accordingly, the thickness H4 of the low refractive layers disposed at the region where the second hole 860 of the first high refractive layer 852 may be greater than the thicknesses H5 and H6 of the low refractive layers in the region where the second holes 860 of the first high refractive layer 852 are not disposed.

Meanwhile, although not shown in the drawings, the touch panel 120 may be formed by forming a third low refractive layer 755 on a substrate, forming a second high refractive layer 754 on the third low refractive layer 755, forming a plurality of second touch electrodes 270 on the second high refractive layer 754, forming a second low refractive layer 953 on the substrate on which the plurality of second touch electrodes 270 are formed, forming a plurality of first touch electrodes 260 on the second low refractive layer 953, forming a first high refractive layer 852 including at least one second hole 860 on the substrate on which the first touch electrodes 260 are formed, and then forming a first low refractive layer 751 on the first high refractive layer 852.

Thereafter, the substrate disposed on one surface of the third low refractive layer 755 may be removed, and the first low refractive layer 751 may be attached to one surface of the display panel 110 so as to form the touch display device 100.

Accordingly, the second hole 860 of the first high refractive layer 852 may be disposed to expose a portion of the lower surface of the second low refractive layer 953 disposed on the first high refractive layer 852, and the first low refractive layer 751 disposed under the first high refractive layer 852 may be disposed in the second hole 860.

As described above, the touch panel 120 according to the embodiment of the present disclosure may include the second hole 860 of the first high refractive layer 852 through which at least two low refractive layers (e.g., a first and a second low refractive layer) may be in contact with each other, so that it is possible to prevent or at least reduce the side visibility from being reduced by the external light L3.

Specifically, a part of the external light L3 passes through the third low refractive layer 755 of the touch display device 100, and may sequentially pass through the second high refractive layer 754 and the second low refractive layer 953.

The external light L3 passing through the second low refractive layer 953 may be incident on the first low refractive layer 751 disposed in the second hole 860 of the first high refractive layer 852. Here, since the refractive indices of the second low refractive layer 953 and the first low refractive layer 751 correspond to or are similar to each other, there may hardly occur the refraction when the external light L3 is incident from the second low refractive layer 953 to the first low refractive layer 751.

As described above, the light passing through the first low refractive layer 751 may be incident on the display panel 110. In addition, the external light L3 may be reflected by the plurality of electrodes and the plurality of lines included in the display panel 110 to be incident on the first low refractive layer 751 again.

The external light L3 may pass through the first low refractive layer 751 to reach the first high refractive layer 852. However, due to the difference in refractive index between the first low refractive layer 751 and the first high refractive layer 852, the external light L3 may be totally reflected at the interface between the first low refractive layer 751 and the first high refractive layer 852. Specifically, the external light L3 incident on the first high refractive layer 852 may be incident at an angle greater than the total reflection critical angle, and may be totally reflected at the interface between the first high refractive layer 852 and the first low refractive layer 751.

Then, the external light L3 totally reflected at the interface between the first high refractive layer 852 and the first low refractive layer 751 may reach the display panel 110, and may be re-reflected by the plurality of electrodes and the plurality of lines to be incident on the first low refractive layer 751 again.

As described above, the external light L3 passing through the low refractive layers disposed in the second hole 860 of the first high refractive layer 852 may be trapped in the touch panel 120, and mey be not emitted to the outside. Therefore, there may reduce the amount of the external light L3 emitted to the outside of the touch display device 100.

In addition, in the present disclosure, another structure for improving the visibility of the touch display device 100 may be included.

Figure 10:
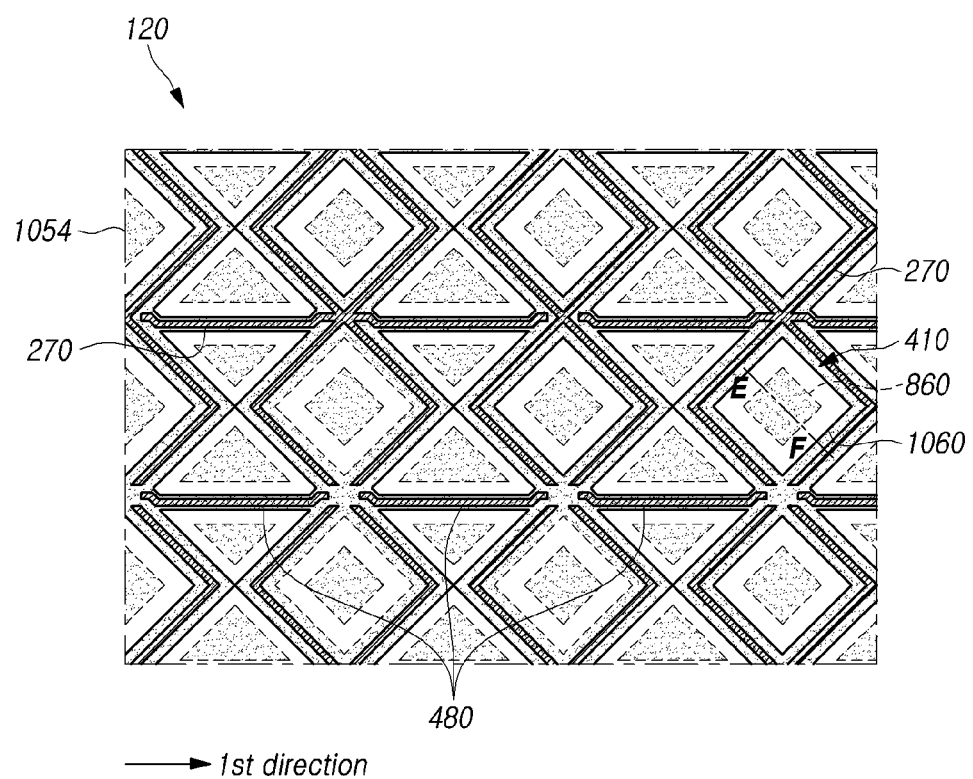
FIG. 10 is a plan view schematically illustrating a structure of a touch panel according to a third embodiment of the present disclosure.
Figure 11:
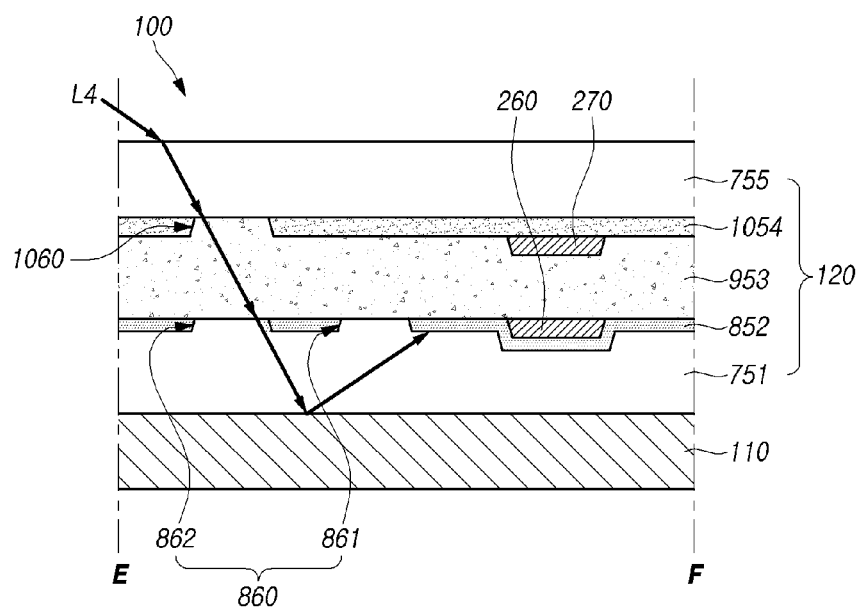
FIG. 11 is a cross-sectional view along line E-F of FIG. 10 according to the third embodiment of the present disclosure.

FIG. 10 is a plan view schematically illustrating a structure of a touch panel according to a third embodiment of the present disclosure. FIG. 11 is a cross-sectional view along line E-F of FIG. 10 according to the third embodiment of the present disclosure.

In describing the present embodiment, descriptions of the same or corresponding components as in the previous embodiment will be omitted. Hereinafter, it will be described the touch panel 120 according to the present embodiment with reference to FIGS. 10 and 11.

Referring to FIG. 10, the touch panel 120 according to the embodiment of the present disclosure may include a plurality of first touch electrodes 260, a plurality of second touch electrodes 270, a plurality of openings 410, and a plurality of dummy patterns 480.

For example, with reference to FIG. 10, the first touch electrodes 260, the second touch electrodes 270, the openings 410, and the dummy patterns 480 included in the touch panel 120 of the present embodiment may be the same as the first touch electrode 260, the second touch electrode 270, the opening 410, and the dummy pattern 480 described with reference to FIG. 4.

The touch panel 120 according to the present embodiment may include a plurality of insulating layers. In addition, at least one insulating layer among the plurality of insulating layers may include a second hole 860, and another insulating layer 1054 may include a third hole 1060.

Here, the second hole 860 of FIG. 10 may be the same as the second hole 860 described with reference to FIGS. 8 and 9.

Each of the second hole 860 and the third hole 1060 may have a closed curved shape in plan view.

For example, in the case that the shape of the opening 410 by the first and second touch electrodes 260 and 270 is a rhombus shape, the shape of the second hole 860 and the third hole 1060 may also be a rhombus shape. That is, the shapes of the second hole 860 and the third hole 1060 may correspond to the shape of the opening 410, but the embodiment of the present disclosure is not limited thereto, and the shapes of the second hole 860 and the third hole 1060 may be changed to various shapes.

Also, as described with reference to FIGS. 8 and 9, the second hole 860 may include one or more pattern holes corresponding to one opening 410.

Here, at least one of the pattern holes of the second hole 860 may overlap the third hole 1060.

For example, in the case that the second hole 860 has a structure including the first pattern hole 861 and the second pattern hole 862 as shown in FIGS. 8 and 9, the third hole 1060 may overlap the second pattern hole 862 of the second hole 860.

However, the structure according to the embodiment of the present disclosure is not limited thereto, and the third hole 1060 may overlap the first pattern hole 861 of the second hole 860 or may overlap each of the first and second pattern holes 861 and 862 of the second hole 860.

Although not shown in the drawing, if the first and second touch electrodes are arranged in a mesh type as in the structure of FIG. 2, the third hole 1060 may be disposed in an area overlapping the opening OP of FIG. 2.

Each of the second hole 860 and the third hole 1060 may not overlap the first touch electrode 260 and the second touch electrode 270.

Specifically, referring to FIG. 11, the touch panel 120 disposed on the display panel 110 may include first to third low refractive layers 751, 953 and 755, and first and second high refractive layers 852 and 1054, respectively. Here, the refractive indices of the first to third low refractive layers 751, 953 and 755 may be less than the refractive indices of the first and second high refractive layers 852 and 1054.

The first low refractive layer 751 of the touch panel 120 may be disposed on the display panel 110, and the first high refractive layer 852 may be disposed on the first low refractive layer 751.

The first high refractive layer 852 may include at least one second hole 860. Here, the second hole 860 may include a first pattern hole 861 and a second pattern hole 862 that are spaced apart from each other.

The first touch electrode 260 may be disposed on the first high refractive layer 852.

The first touch electrode 260 may not overlap the first pattern hole 861 and the second pattern hole 862.

The second low refractive layer 953 may be disposed on the first high refractive layer 852 on which the first touch electrode 260 is disposed.

Each of the first pattern hole 861 and the second pattern hole 862 of the first high refractive layer 852 may be disposed to expose a portion of the lower surface of the second low refractive layer 953. In addition, a first low refractive layer 751 may be disposed in the first pattern hole 861 and the second pattern hole 862.

Accordingly, in the region where the first and second pattern holes 861 and 862 of the first high refractive layer 852 are disposed, the first and second low refractive layers 751 and 953 having a lower refractive index than that of the first high refractive layer 852 may be sequentially stacked.

The second touch electrode 270 may be disposed on the second low refractive layer 953.

The second high refractive layer 1054 (the insulating layer 1054 of FIG. 10) may be disposed on the second low refractive layer 953 on which the second touch electrode 270 is disposed.

The second high refractive layer 1054 may include at least one third hole 1060. Here, the third hole 1060 may overlap at least one of the first pattern hole 861 and the second pattern hole 862 of the second hole 860 of the first high refractive layer 852. Accordingly, the third hole 1060 of the second high refractive layer 1054 may not overlap the first touch electrode 260 and the second touch electrode 270.

The third low refractive layer 755 may be disposed on the second high refractive layer 1054.

Meanwhile, the third hole 1060 of the second high refractive layer 1054 may be disposed to expose a portion of the lower surface of the third low refractive layer 755. In addition, the second low refractive layer 953 may be disposed in the third hole 1060.

In other words, the second low refractive layer 953 may be in contact with a portion of the lower surface of the third low refractive layer 755 through the third hole 1060.

Accordingly, in the region where the third hole 1060 is disposed, there may sequentially stacked the second and third low refractive layers 953 and 755 having a refractive index less than that of the second high refractive layer 1054 and having refractive indices similar or identical to each other.

In addition, in the region where the third hole 1060 overlaps the second hole 860, there may sequentially stacked the first to third low refractive layers 751, 953 and 755 having a refractive index less than that of the first and second high refractive layers 852 and 1054 and having refractive indices similar or identical to each other.

Accordingly, the external light L4 incident to the region where the third hole 1060 and the second hole 860 overlap may be incident on the display panel 110 through the third low refractive layer 755, the second low refractive layer 953, and the first low refractive layer 751 in sequence.

At this time, since the refractive indices of each of the first to third low refractive layers 751, 953 and 755 are the same or similar to each other, the external light L4 incident to the region where the third hole 1060 and the second hole 860 overlap may be hardly refracted while passing through the first to third low refractive layers 751, 953 and 755.

The external light L4 incident on the display panel 110 may be reflected by a plurality of electrodes and a plurality of lines included in the display panel 110 to be incident on the first low refractive layer 751 again.

The external light L4 may pass through the first low refractive layer 751 to reach the first high refractive layer 852. However, due to the difference in refractive index between the first low refractive layer 751 and the first high refractive layer 852, the external light L4 may be totally reflected at the interface between the first low refractive layer 751 and the first high refractive layer 852.

Then, the external light L4 totally reflected at the interface between the first high refractive layer 852 and the first low refractive layer 751 may reach the display panel 110, and there may be repeated the process of the external light L4 being re-reflected by the plurality of electrodes and the plurality of lines of the display panel 110 and being incident on the first low refractive layer 751 again.

As described above, the external light L4 passing through the low refractive layers disposed in the second hole 860 of the first high refractive layer 852 and the third hole 1060 of the second high refractive layer 1054 is trapped in the touch panel 120 and may not be emitted to the outside, and the external light L4 incident on the touch panel 120 is reflected in the touch display device 100. Accordingly, there may reduce the amount emitted to the outside of the touch display device 100, thereby providing an effect of improving the visibility of the touch display device 100.

In addition, in the present disclosure, another structure for improving the visibility of the touch display device 100 may be included.

Figure 12:
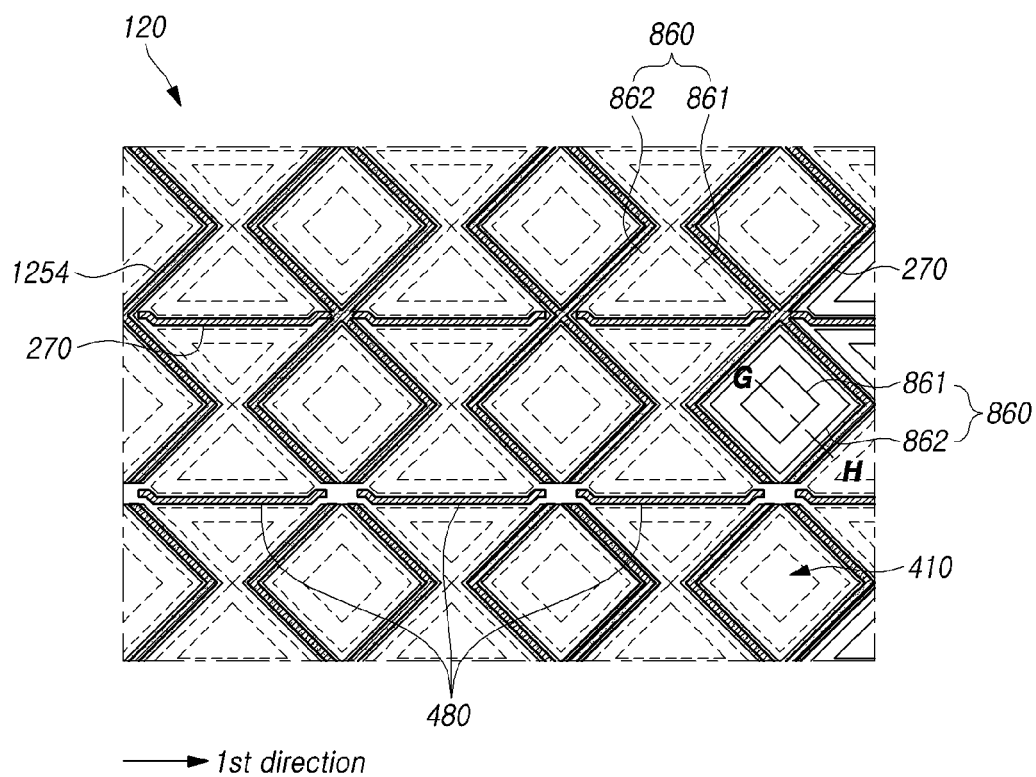
FIG. 12 is a plan view schematically illustrating a structure of a touch panel according to a fourth embodiment of the present disclosure.
Figure 13:
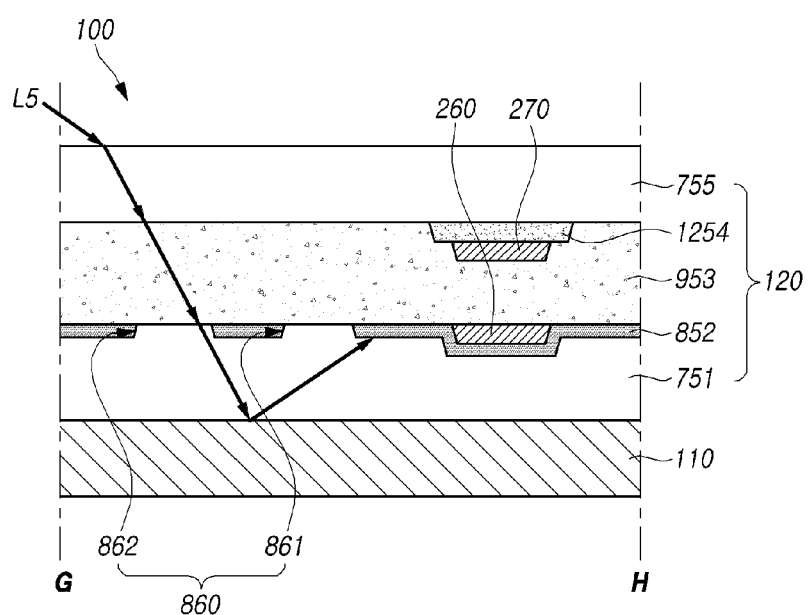
FIG. 13 is a cross-sectional view along line G-H of FIG. 12 according to the fourth embodiment of the present disclosure.

FIG. 12 is a plan view schematically illustrating a structure of a touch panel according to a fourth embodiment of the present disclosure. FIG. 13 is a cross-sectional view along line G-H of FIG. 12 according to the fourth embodiment of the present disclosure.

In describing the present embodiment, descriptions of the same or corresponding components as in the previous embodiment will be omitted. Hereinafter, it will be described the touch panel 120 according to the present embodiment with reference to FIGS. 12 and 13.

Referring to FIG. 12, the touch panel 120 according to the embodiment of the present disclosure may include a plurality of first touch electrodes 260, a plurality of second touch electrodes 270, a plurality of openings 410, and a plurality of dummy patterns 480.

For example, with reference to FIG. 12, the first touch electrodes 260, the second touch electrodes 270, the openings 410, and the dummy patterns 480 included in the touch panel 120 of the present embodiment may be the same as the first touch electrode 260, the second touch electrode 270, the opening 410, and the dummy pattern 480 described with reference to FIG. 4.

The touch panel 120 according to the present embodiment may include a plurality of insulating layers. In addition, at least one insulating layer among the plurality of insulating layers may include a second hole 860. The touch panel 120 may further include another insulating layer 1254 overlapping the plurality of first touch electrodes 260 and the plurality of second touch electrodes 270.

Here, the second hole 860 of FIG. 12 may be the same as the second hole 860 described with reference to FIGS. 8 and 9.

The insulating layer 1254 may include a region extending in a first direction. The insulating layer 1254 extending in the first direction may overlap the plurality of first touch electrodes 260 and the plurality of second touch electrodes 270 extending in the first direction.

In addition, the insulating layer 1254 may include a region extending in a second direction. The insulating layer 1254 extending in the second direction may overlap the plurality of first touch electrodes 260 and the plurality of second touch electrodes 270 extending in the second direction.

Also, the insulating layer 1254 may be disposed to overlap the dummy pattern 480 as well.

The insulating layer 1254 may include an opening in a region corresponding to the opening 410 formed by the first and second touch electrodes 260 and 270.

In addition, the insulating layer 1254 may be disposed so as not to overlap the second hole 860.

Specifically, referring to FIG. 13, the touch panel 120 disposed on the display panel 110 may include first to third low refractive layers 751, 953 and 755, and first and second high refractive layers 852 and 1254. Here, the refractive indices of the first to third low refractive layers 751, 953 and 755 may be smaller than the refractive indices of the first and second high refractive layers 852 and 1254.

The first low refractive layer 751 of the touch panel 120 may be disposed on the display panel 110, and the first high refractive layer 852 may be disposed on the first low refractive layer 751.

The first high refractive layer 852 may include at least one second hole 860. Here, the second hole 860 may include a first pattern hole 861 and a second pattern hole 862 that are spaced apart from each other.

The first touch electrode 260 may be disposed on the first high refractive layer 852.

The first touch electrode 260 may not overlap the first pattern hole 861 and the second pattern hole 862.

The second low refractive layer 953 may be disposed on the first high refractive layer 852 on which the first touch electrode 260 is disposed.

Each of the first pattern hole 861 and the second pattern hole 862 of the first high refractive layer 852 may be disposed to expose a portion of the lower surface of the second low refractive layer 953. In addition, the first low refractive layer 751 may be disposed in the first pattern hole 861 and the second pattern hole 862.

The second touch electrode 270 may be disposed on the second low refractive layer 953.

The second high refractive layer 1254 (the insulating layer 1254 of FIG. 12) may be disposed on the second touch electrode 270.

The second high refractive layer 1254 may overlap a portion of the second low refractive layer 953. Also, the second high refractive layer 1254 may overlap the first touch electrode 260 and the second touch electrode 270, and may not overlap the second hole 860 of the first high refractive layer 852.

The second high refractive layer 1254 is disposed to overlap the first touch electrode 260 and the second touch electrode 270, so that when the third low refractive layer 755 and the substrate are separated in the manufacturing process of the touch panel 120, there may prevent or at least reduce the first touch electrode 260 and the second touch electrode 270 from being damaged by a laser or the like.

The third low refractive layer 755 may be disposed on the second high refractive layer 1254 and the second low refractive layer 953.

In the region where the second high refractive layer 1254 is not disposed, there may sequentially stacked the second and third low refractive layers 953 and 755 having a refractive index lower than that of the second high refractive layer 1254 and having similar or identical refractive indices to each other.

In addition, in the region where the area in which the second high refractive layer 1254 is not disposed overlaps the second hole 860 of the first high refractive layer 852, there may sequentially stacked the first to third low refractive layers 751, 953 and 755 having a refractive index less than that of the first and second high refractive layers 852 and 1254 and having similar or identical refractive indices to each other.

Accordingly, the external light L5 incident to the region where the area in which the second high refractive layer 1254 is not disposed overlaps the second hole 860 of the first high refractive layer 852 may be incident on the display panel 110 through the third low refractive layer 755, the second low refractive layer 953, and the first low refractive layer 751 in sequence.

Since the refractive indices of each of the first to third low refractive layers 751, 953 and 755 are the same or similar to each other, the external light L5 incident to the region where the area in which the second high refractive layer 1254 is not disposed overlaps the second hole 860 of the first high refractive layer 852 may be hardly refracted while passing through the first to third low refractive layers 751, 953 and 755.

The external light L5 incident on the display panel 110 may be reflected to be incident on the first low refractive layer 751 again.

Then, the external light L5 may pass through the first low refractive layer 751 to reach the first high refractive layer 852. However, due to the difference in refractive index between the first low refractive layer 751 and the first high refractive layer 852, the external light L5 may be totally reflected at the interface between the first low refractive layer 751 and the first high refractive layer 852.

In addition, the external light L5 totally reflected at the interface between the first high refractive layer 852 and the first low refractive layer 751 may reach the display panel 110, and there may be repeated the process of the light being re-reflected by the display panel 110 and being incident on the first low refractive layer 751 again.

As described above, the external light L5 passing through the low refractive layers disposed in the region where the area in which the second high refractive layer 1254 is not disposed overlaps the second hole 860 of the first high refractive layer 852 may be trapped in the touch panel 120 and may not be emitted to the outside.

In addition, in the present disclosure, another structure for improving the visibility of the touch display device 100 may be included.

Figure 14:
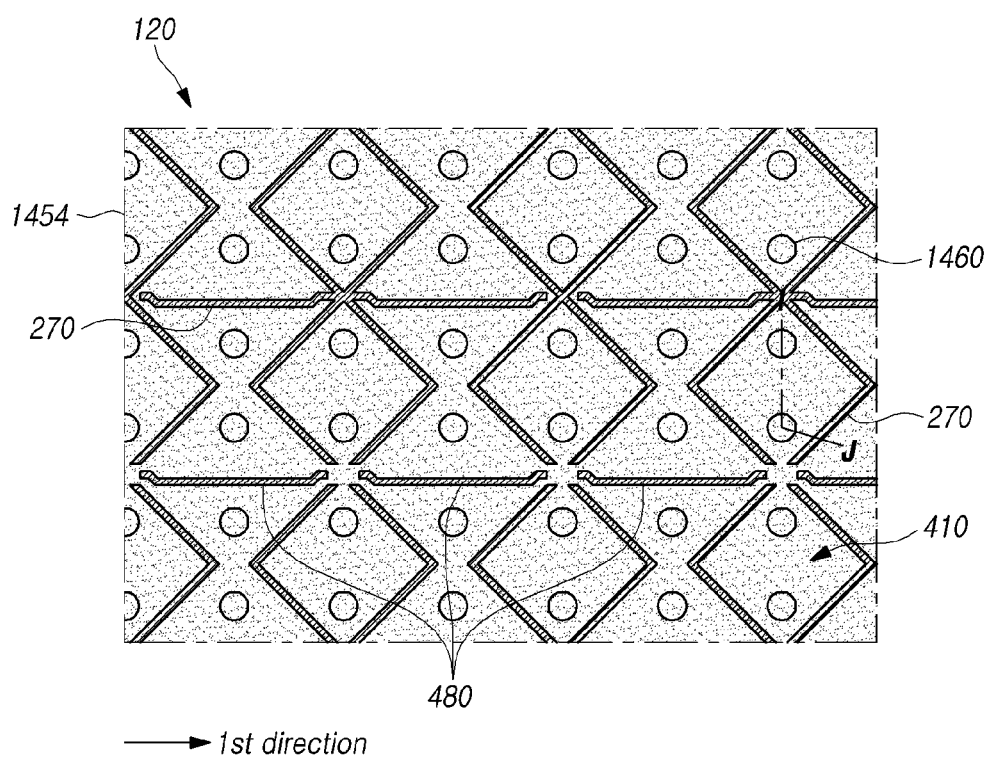
FIG. 14 is a plan view schematically illustrating a structure of a touch panel according to a fifth embodiment of the present disclosure.
Figure 15:
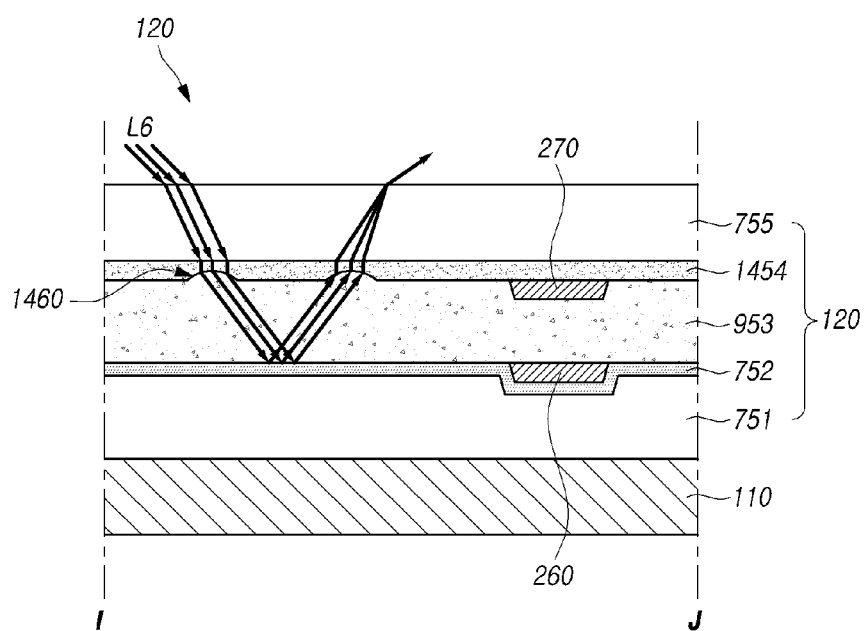
FIG. 15 is a cross-sectional view along line I-J of FIG. 14 according to the fifth embodiment of the present disclosure.

FIG. 14 is a plan view schematically illustrating a structure of a touch panel according to a fifth embodiment of the present disclosure. FIG. 15 is a cross-sectional view along line I-J of FIG. 14 according to the fifth embodiment of the present disclosure.

Referring to FIG. 14, the touch panel 120 according to the embodiment of the present disclosure may include a plurality of first touch electrodes 260, a plurality of second touch electrodes 270, a plurality of openings 410, and a plurality of dummy patterns 480.

For example, with reference to FIG. 14, the first touch electrodes 260, the second touch electrodes 270, the openings 410, and the dummy patterns 480 included in the touch panel 120 of the present embodiment may be the same as the first touch electrode 260, the second touch electrode 270, the opening 410, and the dummy pattern 480 described with reference to FIG. 4.

The touch panel 120 according to the present embodiment may include a plurality of insulating layers. In addition, at least one insulating layer 1454 among the plurality of insulating layers may include at least one depression 1460.

The shape of the depression 1460 may be circular in plan view, but the shape of the depression 1460 according to the embodiments of the present disclosure is not limited thereto. The shape of the depression 1460 may be formed in various shapes such as polygons or ellipses in plan view.

Specifically, at least one of the plurality of insulating layers may include at least one depression 1460 provided in a region overlapping the opening 410. If there are a plurality of depressions 1460 overlapping one opening 410, the plurality of depressions 1460 overlapping one opening 410 may be disposed to be spaced apart from each other.

In addition, the depression 1460 may also be disposed in a region between the touch electrodes crossing each other and other adjacent touch electrodes crossing each other (or between one opening 410 and another opening 410 adjacent in the first direction).

In addition, the depression 1460 may not overlap each of the first touch electrode 260 and the second touch electrode 270.

In the case that the depression 1460 of the insulating layer 1454 overlaps the first touch electrode 260 and/or the second touch electrode 270, the first touch electrode 260 and/or the second touch electrode 270 may be exposed to the outside, or the first touch electrode 260 and/or the second touch electrode 270 may be not formed on the flat surface, so that the touch reliability may be lowered.

In addition, as shown in FIG. 14, the depression 1460 disposed to overlap the opening 410 and the depression 1460 not overlapped with the opening may be disposed to be spaced apart from each other.

Since the plurality of depressions 1460 provided in the touch panel 120 are disposed to be spaced apart from each other, there is an effect of lowering the reflectance of external light.

Specifically, referring to FIG. 15, the touch panel 120 disposed on the display panel 110 may include first to third low refractive layers 751, 953 and 755, and first and second high refractive layers 752 and 1454. Here, the refractive indices of the first to third low refractive layers 751, 953 and 755 may be less than the refractive indices of the first and second high refractive layers 752 and 1454.

The first low refractive layer 751 of the touch panel 120 may be disposed on the display panel 110, and the first high refractive layer 752 may be disposed on the first low refractive layer 751.

The first touch electrode 260 may be disposed on the first high refractive layer 752.

The second low refractive layer 953 may be disposed on the first touch electrode 260.

The second touch electrode 270 overlapping the first touch electrode 260 may be disposed on the second low refractive layer 953.

The second high refractive layer 1454 (the insulating layer 1454 of FIG. 14) may be disposed on the second touch electrode 270.

The second high refractive layer 1454 may include at least one depression 1460. The depression 1460 of the second high refractive layer 1454 may not overlap the first touch electrode 260 and the second touch electrode 270.

Meanwhile, when manufacturing the touch panel 120, since at least one depression 1460 is formed in the second high refractive layer 1454, and then the second low refractive layer 953 is formed on the second high refractive layer 1454, the second low refractive layer 953 may be disposed in the depression 1460 of the second high refractive layer 1454.

The depression 1460 of the second high refractive layer 1454 may focus the external light L6 incident into the touch panel 120 and emit the light L6 to the outside of the touch panel 120, thereby reducing the size of the stain caused by the external light L6 and preventing or at least reducing the stain from being recognized.

Specifically, the external light L6 may sequentially transmit the third low refractive layer 755, the second high refractive layer 1454, and the second low refractive layer 953 of the touch panel 120, and may be totally reflected at the interface between the second low refractive layer 953 and the first high refractive layer 752.

The external light L6 totally reflected at the interface between the second low refractive layer 953 and the first high refractive layer 752 passes through the second low refractive layer 953 and is incident on the second high refractive layer 1454. In addition, some of the external light L6 may be incident on the depression 1460 of the second high refractive layer 1454.

The external light L6 may be focused while passing through the depression 1460 of the second high refractive layer 1454, and the focused external light L6 may pass through the third low refractive layer 755, and may be emitted to the outside of the touch panel 120.

As described above, since the external light L6 is focused by the depression 1460 of the second high refractive layer 1454 and emitted to the outside of the touch panel 120, the size of the stain caused by the external light L6 becomes very small, as a result, the stain may not be recognized by the user.

In addition, in the present disclosure, another structure for improving the visibility of the touch display device 100 may be included.

Figure 16:
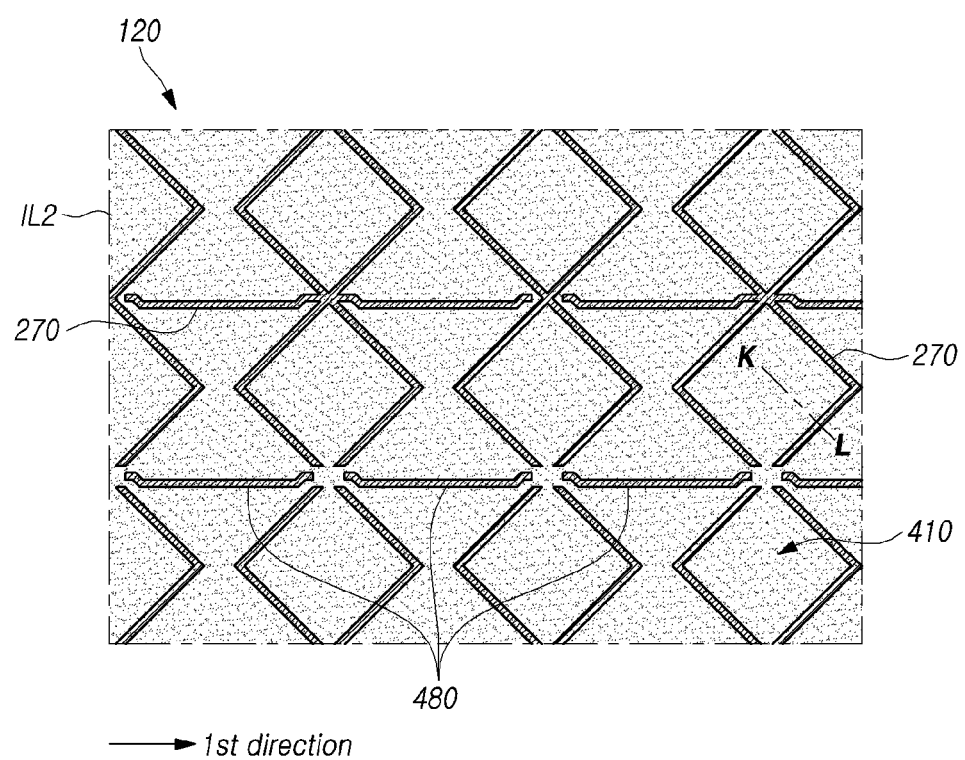
FIG. 16 is a plan view schematically illustrating a structure of a touch panel according to a sixth embodiment of the present disclosure.
Figure 17:
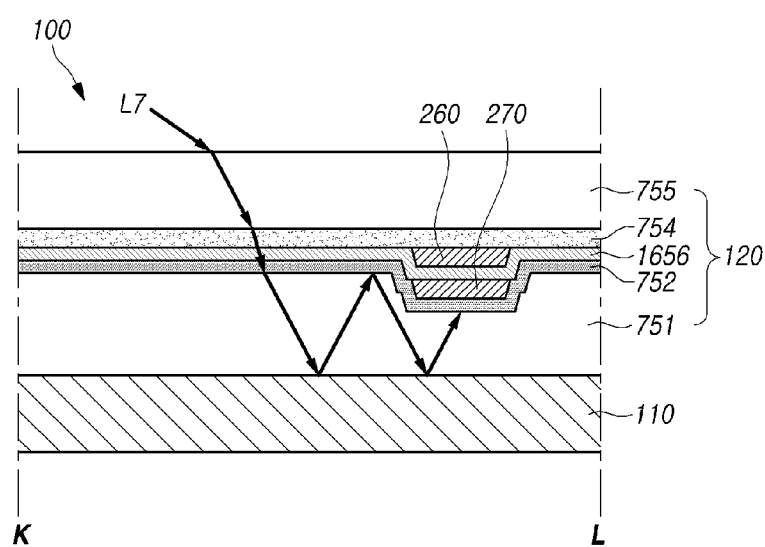
FIG. 17 is a cross-sectional view along line K-L of FIG. 16 according to the sixth embodiment of the present disclosure.

FIG. 16 is a plan view schematically illustrating a structure of a touch panel according to a sixth embodiment of the present disclosure. FIG. 17 is a cross-sectional view along line K-L of FIG. 16 according to the sixth embodiment of the present disclosure.

Referring to FIG. 16, the touch panel 120 according to the embodiment of the present disclosure may include a plurality of first touch electrodes 260, a plurality of second touch electrodes 270, a plurality of openings 410, and a plurality of dummy patterns 480.

For example, with reference to FIG. 16, the first touch electrodes 260, the second touch electrodes 270, the openings 410, and the dummy patterns 480 included in the touch panel 120 of the present embodiment may be the same as the first touch electrode 260, the second touch electrode 270, the opening 410, and the dummy pattern 480 described with reference to FIG. 4.

The touch panel 120 according to the present embodiment may include a plurality of insulating layers. In addition, the plurality of insulating layers may include a structure in which at least three or more high refractive layers IL2 are sequentially stacked.

Through this, the external light is trapped in the touch panel 120 and may not be emitted to the outside, so that the visibility of the touch display device 100 can be improved.

Specifically, referring to FIG. 17, the touch display device 100 may include a first low refractive layer 751 disposed on the display panel 110.

A first high refractive layer 752 may be disposed on the first low refractive layer 751.

A first touch electrode 260 may be disposed on the first high refractive layer 752.

A third high refractive layer 1656 may be disposed on the first high refractive layer 752 on which the first touch electrode 260 is disposed.

The refractive index of the third high refractive layer 1656 may be 2 to 2.2, but the refractive index of the third high refractive layer 1656 of the present disclosure is not limited thereto.

The third high refractive layer 1656 may include an inorganic insulating material. For example, the third high refractive layer 1656 may include any one of silicon oxide (SiOx), silicon nitride (SiNx), and silicon oxynitride (SiON), however, the material of the third high refractive layer 1656 according to the present disclosure is not limited thereto.

A second touch electrode 270 overlapping the first touch electrode 260 may be disposed on the third high refractive layer 1656.

A second high refractive layer 754 may be disposed on the third high refractive layer 1656 on which the second touch electrode 270 is disposed.

A third low refractive layer 755 may be disposed on the second high refractive layer 754.

In other words, the touch panel 120 according to the present embodiment may include first and third low refractive layers 751 and 755, and may include first to third high refractive layers 752, 754 and 1656 disposed between the first and third low refractive layers 751 and 755.

In addition, in a region where the first touch electrode 260 and the second touch electrode 270 are not disposed, the high refractive layers may be sequentially arranged in the order of the first high refractive layer 752, the third high refractive layer 1656 and the second high refractive layer 754. Specifically, a portion of the upper surface of the first high refractive layer 752 may be in contact with a portion of the rear surface of the third high refractive layer 1656, and a portion of the upper surface of the third high refractive layer 1656 may be in contact with a portion of the rear surface of the second high refractive layer 754.

Here, the refractive indices of the first and third low refractive layers 751 and 755 may be less than the refractive indices of the first to third high refractive layers 752, 754 and 1656.

Accordingly, the external light L7 incident on the touch panel 120 may pass through the third low refractive layer 755, and be refracted and incident into the second high refractive layer 754.

The external light L7 may pass through the third high refractive layer 1566 and the first high refractive layer 752 having a refractive index similar to or the same as that of the second high refractive layer 754, and may be refracted and incident on the first low refractive layer 751.

Thereafter, the external light L7 may pass through the first low refractive layer 751 and be incident on the display panel 110, and then may be reflected by the components of the display panel 110 and be incident on the first low refractive layer 751 again.

The external light L7 may pass through the first low refractive layer 751 to reach the first high refractive layer 752. Due to the difference in refractive index between the first low refractive layer 751 and the first high refractive layer 752, the external light L7 may be totally reflected at the interface between the first low refractive layer 751 and the first high refractive layer 752.

Then, the external light L7 totally reflected at the interface between the first high refractive layer 752 and the first low refractive layer 751 may reach the display panel 110, and there may be repeated the process of being reflected back by the display panel 110 and being incident on the first low refractive layer 751 again.

As described above, the external light L7 that has passed through the regions in which the first to third high refractive layers 752, 754 and 1656 are sequentially stacked may be trapped in the touch panel 120 and may not be emitted to the outside of the touch panel 120, thereby reducing the external light reflectance.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A touch display device comprising:
   a display panel;
   an adhesive layer disposed on a first part of the display panel;
   a touch panel disposed on the first part of the display panel and the touch panel attached to the first part of the display panel based on the adhesive layer, the touch panel including a plurality of touch electrodes;
   a first insulation layer disposed on a second part of the display panel;
   a second insulation layer disposed on the first insulation layer and in direct contact with the first insulation layer; and
   a third insulation layer disposed on the second insulation layer and in direct contact with the second insulation layer such that a touch electrode from the plurality of touch electrodes is between a portion of the second insulation layer and a portion of the third insulation layer,
   wherein refractive indices of the first insulation layer and the third insulation layer are lower than a refractive index of the second insulation layer, and
   wherein a first thickness of at least part of the first insulation layer or a second thickness of at least part of the third insulation layer is larger than a third thickness of the second insulation layer.

2. The touch display device of claim 1, further comprising:
   a fourth insulation layer disposed on the third insulation layer; and
   a fifth insulation layer disposed on the fourth insulation layer,
   wherein refractive indices of the first insulation layer, the third insulation layer, and the fifth insulation layer are lower than refractive indices of the second insulation layer and the fourth insulation layer.

3. The touch display device of claim 1, wherein the first insulation layer is an optical clear adhesive (OCA) layer.

4. The touch display device of claim 1, wherein the display panel comprises an encapsulation layer in the first part of the display panel, the encapsulation layer including a first inorganic layer, an organic layer disposed on the first inorganic layer, and a second inorganic layer disposed on the first inorganic layer.

5. The touch display device of claim 1, further comprising:
   a data driving circuit configured to drive data lines of the display panel; and
   a touch driving circuit configured to supply a touch driving signal to the plurality of touch electrodes of the touch panel,
   wherein the data driving circuit and the touch driving circuit are physically separate circuits.

6. The touch display device of claim 5, wherein the plurality of touch electrodes are arranged in a mesh type.

7. The touch display device of claim 5, wherein the plurality of touch electrodes comprise a first touch electrode and a second touch electrode disposed on different layers.

8. The touch display device of claim 7, wherein the first touch electrode and the second touch electrode overlap each other in at least a partial area of the touch panel with at least one insulating layer interposed there between.

9. The touch display device of claim 8, wherein a portion of the first touch electrode and the second touch electrode overlapping each other extends in a first direction.

10. The touch display device of claim 9, wherein other portions of the first touch electrode and the second touch electrode overlapping each other extend in a second direction that intersects the first direction.

11. The touch display device of claim 1, wherein the touch panel and the display panel are separately manufactured through different panel manufacturing processes and then bonded.

12. The touch display device of claim 7, wherein the touch panel is driven in a manner that senses the amount of change in capacitance formed between the first touch electrode and the second touch electrode.

13. The touch display device of claim 1, wherein the display panel comprises:
    a substrate having a bendable or foldable property;
    at least one transistor disposed on the substrate; and
    an encapsulation portion disposed on the at least one transistor.

14. The touch display device of claim 13, wherein the adhesive layer is disposed on the encapsulation portion.

15. The touch display device of claim 13, wherein the at least one transistor comprises:
    a buffer layer disposed on the substrate;
    an active layer disposed on the buffer layer;
    a gate insulating layer disposed on the active layer;
    a gate electrode on the gate insulating layer;
    an interlayer insulating layer disposed on the gate electrode;
    a source electrode and a drain electrode disposed on the interlayer insulating layer, each of the source electrode and the drain electrode being in contact with the active layer through a contact hole provided in the interlayer insulating layer and the gate insulating layer; and
    a planarization layer disposed on the source electrode and the drain electrode.

16. A touch display device comprising:
    a display panel;
    an adhesive layer disposed on a first part of the display panel;
    a touch panel disposed on the first part of the display panel and the touch panel attached to the first part of the display panel based on the adhesive layer, the touch panel including a plurality of touch electrodes;
    a first insulation layer disposed on a second part of the display panel;
    a second insulation layer disposed on the first insulation layer; and
    a third insulation layer disposed on the second insulation layer such that a touch electrode from the plurality of touch electrodes is between a portion of the second insulation layer and a portion of the third insulation layer, wherein refractive indices of the first insulation layer and the third insulation layer are lower than a refractive index of the second insulation layer, and wherein a first thickness of at least part of the first insulation layer or a second thickness of at least part of the third insulation layer is larger than a third thickness of the second insulation layer, wherein a first thickness of a first portion of the first insulation layer that is non-overlapping with the touch electrode is thicker than a second thickness of a second portion of the first insulation layer that is overlapping with the touch electrode.

17. The touch display device of claim 16, wherein the first portion of the first insulation layer is disposed within a hole in the second insulation layer.

* * * * *